(12) United States Patent
Hirotsuru et al.

(10) Patent No.: US 9,516,741 B2
(45) Date of Patent: Dec. 6, 2016

(54) BORON NITRIDE/RESIN COMPOSITE CIRCUIT BOARD, AND CIRCUIT BOARD INCLUDING BORON NITRIDE/RESIN COMPOSITE INTEGRATED WITH HEAT RADIATION PLATE

(71) Applicant: Denka Company Limited, Chuo-ku, Tokyo (JP)

(72) Inventors: Hideki Hirotsuru, Omuta (JP); Shuhei Nonaka, Omuta (JP); Toshikatsu Mitsunaga, Omuta (JP); Koki Ikarashi, Omuta (JP); Kouji Miyata, Omuta (JP); Taiki Nishi, Omuta (JP); Saori Inoue, Omuta (JP); Fumiya Kobayashi, Omuta (JP)

(73) Assignee: Denka Company Limited, Chuo-Ku, Tokyo (JP)

( * ) Notice: Subject to any disclaimer, the term of this patent is extended or adjusted under 35 U.S.C. 154(b) by 0 days.

(21) Appl. No.: 14/911,707

(22) PCT Filed: Aug. 12, 2014

(86) PCT No.: PCT/JP2014/071277
§ 371 (c)(1),
(2) Date: Feb. 11, 2016

(87) PCT Pub. No.: WO2015/022956
PCT Pub. Date: Feb. 19, 2015

(65) Prior Publication Data
US 2016/0227644 A1 Aug. 4, 2016

(30) Foreign Application Priority Data

Aug. 14, 2013 (JP) ................................. 2013-168565
Jan. 16, 2014 (JP) ................................. 2014-005776
Jul. 22, 2014 (JP) ................................. 2014-149204

(51) Int. Cl.
*H05K 1/02* (2006.01)
*H05K 1/09* (2006.01)
(Continued)

(52) U.S. Cl.
CPC ............... *H05K 1/0271* (2013.01); *C08K 7/00* (2013.01); *H05K 1/0203* (2013.01);
(Continued)

(58) Field of Classification Search
CPC ............. H05K 1/0271; H05K 1/0203; H05K 1/0373; H05K 1/09; H05K 1/0353; C08K 7/00
See application file for complete search history.

(56) References Cited

U.S. PATENT DOCUMENTS 4,882,455 A 11/1989 Sato
5,531,945 A 7/1996 Ohya
(Continued)

FOREIGN PATENT DOCUMENTS

JP 62-26886 A 2/1987
JP 05-291706 A 5/1993
(Continued)

OTHER PUBLICATIONS

International Search Report mailed Nov. 4, 2014, issued in corresponding International Application No. PCT/2014/071277, filed Aug. 12, 2014, 5 pages.

*Primary Examiner* — Timothy Thompson
*Assistant Examiner* — Amol Patel
(74) *Attorney, Agent, or Firm* — Christensen O'Connor Johnson Kindness PLLC

(57) ABSTRACT

A boron nitride/resin composite circuit board having high heat dissipation characteristics and high reliability is provided. A boron nitride/resin composite circuit board, including: a plate-shaped resin-impregnated boron nitride sintered body having a plate thickness of 0.2 to 1.5 mm, the plate-shaped resin-impregnated boron nitride sintered body including 30 to 85 volume % of a boron nitride sintered body having boron nitride particles bonded three-dimensionally, the boron nitride particles having an average long diameter of 5 to 50 μm, and 70 to 15 volume % of a resin; and a metal circuit adhered onto both principal planes of the plate-shaped resin-impregnated boron nitride sintered body, the metal circuit being copper or aluminum, wherein: a ratio of a linear thermal expansion coefficient in a plane direction of the resin-impregnated boron nitride sintered body at 40 to 150° C. (CTE1) and a linear thermal expansion coefficient of the metal circuit at 40 to 150° C. (CTE2) (CTE1/CTE2) is 0.5 to 2.0.

13 Claims, 2 Drawing Sheets

(51) Int. Cl.
  H05K 1/03    (2006.01)
  C08K 7/00    (2006.01)
  H05K 3/02        (2006.01)
  H05K 3/38        (2006.01)
  C08K 3/38        (2006.01)

(52) U.S. Cl.
  CPC ......... H05K 1/0353 (2013.01); H05K 1/0373 (2013.01); H05K 1/09 (2013.01); *C08K 2003/385* (2013.01); *C08K 2201/004* (2013.01); *H05K 1/0306* (2013.01); *H05K 3/022* (2013.01); *H05K 3/38* (2013.01); *H05K 2201/0104* (2013.01); *H05K 2201/066* (2013.01)

(56) References Cited

U.S. PATENT DOCUMENTS

| | | | | |
|---|---|---|---|---|
| 2002/0058140 A1* | 5/2002 | Dana | ............... | C03C 25/101 428/375 |
| 2002/0085888 A1* | 7/2002 | Velpari | ............... | C03C 25/101 408/1 R |
| 2002/0123285 A1* | 9/2002 | Dana | ............... | C03C 25/101 442/237 |
| 2011/0192588 A1* | 8/2011 | Suzuki | ............... | C08J 5/18 165/185 |
| 2012/0067145 A1 | 3/2012 | Suzuki | | |
| 2012/0188730 A1* | 7/2012 | Miyata | ............... | H05K 1/0373 361/748 |
| 2013/0337269 A1* | 12/2013 | Ohtsuka | ............... | C08K 3/08 428/418 |
| 2014/0377534 A1* | 12/2014 | Su | ............... | H05K 1/0306 428/317.7 |

FOREIGN PATENT DOCUMENTS

| | | |
|---|---|---|
| JP | 06-152086 A | 5/1994 |
| JP | 2001-196512 A | 7/2001 |
| JP | 2002-212309 A | 7/2002 |
| JP | 2008-248048 A | 10/2008 |
| JP | 2010-153538 A | 8/2010 |
| JP | 2010-275149 A | 9/2010 |

* cited by examiner

BORON NITRIDE/RESIN COMPOSITE CIRCUIT BOARD, AND CIRCUIT BOARD INCLUDING BORON NITRIDE/RESIN COMPOSITE INTEGRATED WITH HEAT RADIATION PLATE

TECHNICAL FIELD

The present invention is related to a circuit board which satisfies both of a heat dissipation characteristics and a superior heat resistant cycle characteristics.

BACKGROUND

Regarding exothermic electronic parts such as power devices, double-side heat dissipation transistors, thyristors, CPU and the like, efficient heat dissipation during their use is important. Generally, conventional measures for such heat dissipation were to (1) improve thermal conductivity of the insulating layer of a printed-wiring board onto which the exothermic electronic parts are to be mounted, and (2) mount the exothermic electronic parts or the printed-wiring board having the exothermic electronic parts mounted thereon onto a heat sink via a thermal interface materials having electric insulation. As the insulating layer of the printed-wiring board and the thermal interface materials, heat dissipating member obtained by curing silicone resin and epoxy resin added with ceramics powder is used.

In recent years, higher speed and higher integration of the circuit in the exothermic electronic parts and higher density of the exothermic electronic parts being mounted onto the printed-wiring board have lead to higher heat generation density and more precise structure in the electronic devices. Accordingly, heat dissipating member having even higher thermal conductivity, being thin and having high strength, has been required.

In addition, with respect to the usage in power modules such as elevators, vehicles, hybrid cars and the like, ceramics substrates made of alumina, beryllia, silicon nitride, aluminum nitride and the like are used in view of thermal conductivity, cost, safety and the like. These ceramics substrates are bonded to a metal circuit plate and to a heat dissipation board and are used as the circuit board. Due to superior insulation characteristics and heat dissipation characteristics with respect to metal substrates having a resin substrate or a resin layer as the insulating material, they are used as the substrate for installing high heat dissipation electronic parts. In recent years, higher integration, higher frequency, higher output and the like of the semiconductor devices have lead to increase in the calorific value from the semiconductor devices. Accordingly, ceramics substrates of aluminum nitride sintered body and silicon nitride sintered body having high thermal conductivity have been used. In particular, aluminum nitride substrate has high thermal conductivity compared with the silicon nitride substrate, and thus it is suitable as the ceramics circuit board for installing high heat dissipation electronic parts.

However, although the aluminum nitride substrate possesses high thermal conductivity, its mechanical strength and toughness are low. Accordingly, there are disadvantages in that breakage occurs by the tightening in the assembly process, cracks easily occur when subjected to thermal cycle, and the like. In particular, when applied for the power modules used under severe load and thermal conditions, such as vehicle, electric railroad, machining tool, robots and the like, these disadvantages become remarkable. Therefore, as the ceramics substrate for installing electronic parts, improvement in mechanical reliability is required, and thus silicon nitride substrate having superior mechanical strength and toughness, although inferior to aluminum nitride substrate in thermal conductivity, has been attracting attention. On the other hand, such ceramics circuit board is higher in cost than the resin substrate or the metal substrate having resin layer as the insulating material, and thus the utilization of the ceramics circuit board is limited.

From the afore-mentioned circumstances, hexagonal boron nitride having superior properties as the electric insulating materials such as (1) high thermal conductivity, (2) high electric insulating property and the like have been receiving attention. However, while the thermal conductivity of boron nitride is 100 W/(m·K) in the in-plane direction (direction in the a-axis), the thermal conductivity in the thickness direction (direction in the c-axis) is 2 W/(m·K). Accordingly, anisotropy of the thermal conductivity derived from the crystalline structure and the flake shape is large. Accordingly, for example, when the thermal interface materials is manufactured, the in-plane direction (direction in the a-axis) of the boron nitride particle and the thickness direction of the thermal interface materials can come vertical with each other, thereby resulting in cases where the high thermal conductivity of the boron nitride in the in-plane direction (direction in the a-axis) could not be utilized sufficiently. On the other hand, high thermal conductivity of the boron nitride particles in the in-plane direction (direction in the a-axis) can be achieved by allowing the in-plane direction (direction in the a axis) of the boron nitride particles and the thickness direction of the thermal interface materials to come in parallel with each other, however, there is a problem in that the material is weak in the tensile stress in the thickness direction.

In Patent Literature 1, a resin composite material containing high rigidity particles such as ceramics and metals by 40 to 90% by volume fraction, the high rigidity particles being in contact with each other three-dimensionally, and a manufacturing method thereof are disclosed. Here, it is also disclosed that such resin composite material can be suitably used in mechanical parts such as a slide member exemplified as a wire saw roller and a gear wheel.

In addition, Patent Literature 2 discloses a sintered ceramics member having at least forsterite and boron nitride as its main component and having boron nitride aligned in one direction, a probe holder formed by using the ceramics member, and a manufacturing method of the ceramics member. Here, it is also disclosed that such ceramics member can be suitably used as a material for a probe holder, into which a probe is inserted. Here, the probe is for a micro contactor used in inspection of semiconductors and liquid crystals, and electrically connects a circuit structure to be inspected and a circuit structure which output signals for inspection.

Patent Literature 3 discloses a method in which a filler having a large anisotropy in shape or in thermal conductivity is mixed and dispersed in a thermosetting resin material, followed by curing of the thermosetting resin. Subsequently, the cured thermosetting resin is crushed, followed by mixing the thermosetting resin dispersed with the filler and a thermoplastic resin to obtain a resin composition for a mold, and then the resin composition is heated to soften and mold the resin composition into a desired shape.

Patent Literatures 4 and 5 disclose of a method for manufacturing a substrate for a printed circuit board comprising the step of impregnating a thermal setting resin (II) into an inorganic continuous porous body selected from the group consisting of an aluminum nitride-boron nitride composite body (AlN—BN), an alumina-boron nitride composite body ($Al_2O_3$—BN), a zirconium oxide-boron nitride composite body ($ZrO_2$—BN), silicon nitride-boron nitride composite body ($Si_3N_4$—BN), hexagonal boron nitride (h-BN), β-wollastonite (β-$CaSiO_3$), mica, and volcanic soil; and curing to obtain a cured plate body. In addition, it is also disclosed that such substrate for a printed circuit can be suitably used as a substrate for high frequency usage and for directly mounting a semiconductor chip.

Patent Literature 6 discloses a porous body of B—C—N system having a graphite three-dimensional skeletal structure synthesized from a porous polyimide sheet as a starting material, and a heat dissipating material obtained by impregnating a resin in the porous portion to obtain a composite material. Such heat dissipating material has a smaller heat resistance compared with those obtained by impregnating a resin in an ordinary carbon porous body, and an insulating composite material can be obtained by the conversion of the porous body into h-BN. Accordingly, the heat dissipating material is a promising material as a cooling material for electronic parts which require low heat resistance and electric insulating property.

CITATION LIST

Patent Literature

[Patent Literature 1] JP 2002-212309A
[Patent Literature 2] JP 2010-275149A
[Patent Literature 3] JP 2008-248048A
[Patent Literature 4] JP H5-291706A
[Patent Literature 5] JP H6-152086A
[Patent Literature 6] JP 2010-153538A

SUMMARY OF INVENTION

Technical Problem

However, although the method of Patent Literature 1 improves abrasion resistance and electric insulation by impregnating the resin into the molding having ceramics and metal contacting each other three-dimensionally, there is no technical disclosure regarding a heat dissipation material having thermal conductivity, and such has been desired.

In Patent Literature 2, a ceramics member as a sintered body containing at least one of forsterite and boron nitride as the main component, and having the boron nitride aligned in one direction; a probe holder formed by using the ceramics member; and a manufacturing method of the ceramics member are suggested. Here, a ceramics member having free-cutting property as well as thermal expansion coefficient close to that of silicone and high strength is suggested, however, there is no technical disclosure regarding a heat dissipation material having thermal conductivity, and such has been desired.

In the method of Patent Literature 3, thermal conductivity was low as showing a maximum value of 5.8 W/(m·K). In addition, the thermosetting resin needs to be crushed after being obtained, and then the thermosetting resin is mixed and softened again. Accordingly, it was problematic in the viewpoint of reliability due to the possibility of contamination and uniformity of the softening condition of the resin.

In the methods of Patent Literatures 4 and 5, there is no disclosure regarding the impregnation of the resin into the boron nitride sintered body simple substance, and thus the bending strength is as low as 28 MPa, even though the maximum thermal conductivity is 42 W/(m·K). Therefore, it is difficult realize high thermal conductivity and high strength.

In Patent Literature 6, the thickness of the sheet was 100 μm or less, and thus there was a problem in the viewpoint of reliability due to the uniformity of the softening condition of the resin and the boron nitride in the moisture-resistant condition.

In the conventional technique, the heat dissipating member is manufactured via a mixing process to mix the ceramics powder such as boron nitride and the resin, an extrusion molding process, a coating process, a heating process and the like. Therefore, a resin layer exists in between the primary particles of boron nitride, and it is difficult to obtain a structure having the boron nitride crystals contacting with each other three-dimensionally. Accordingly, there was a limit in the improvement in the thermal conductivity. In addition, even when spherical particles of aluminum oxide powders and silicon oxide powders are used, thermal conductivity of these ceramics powders is approximately 20 to 30 W/(m·K) and is lower than that of boron nitride. Further, since the particles are hard, there was a problem in that the apparatus and the mold would be worn down. In addition, in the heat dissipating member manufactured by the conventional technique, the filling amount of the ceramics powder such as the boron nitride needs to be increased up to approximately 60 weight % in order to increase the thermal conductivity, however, since such technique would increase the cost, it was difficult to achieve both of low cost and superior property with the heat dissipating member. Here, a method for manufacturing a circuit substrate having superior workability and strength by allowing a resin to impregnate in a ceramics of which crystal grains have a three-dimensional network structure and open pores, is conventionally known. However, although there is a disclosure that boron nitride and the like is added to provide thermal conductivity, there was no technical suggestion to positively utilize the high thermal conductivity of the boron nitride particle in the in-plane direction (direction in the a-axis), which is as high as 400 W/(m·K). Therefore, conventionally realized heat dissipating members had low thermal conductivity, and were unable to realize the heat dissipation characteristics which can satisfy the yearly increasing market demands.

(First Viewpoint)

Regarding these problems, the first viewpoint of the present invention places importance in the heat dissipating property, and improves thermal conductivity and strength by obtaining a composite material. Specifically, the inner gap of the boron nitride sintered body is impregnated with a resin, and then the impregnated boron nitride sintered body is cut into plates to manufacture the heat dissipating member. Accordingly, the orientation can be controlled in an arbitrary direction, and a heat dissipating member having superior thermal conductivity with arbitrary thickness can be manufactured easily. Therefore, a heat dissipating member which can obtain high reliability with respect to moisture and thermal cycle can be manufactured. In addition, even when the filling amount of the boron nitride is relatively small, the structure having the boron nitride contacting with each other three-dimensionally allows manufacture of a heat dissipating member having superior thermal conductivity. However, there has been no technical suggestion provided in these points of views.

The first viewpoint of the present invention provides a heat dissipating member which is suitably used as a heat dissipating member of thermogenic electronic parts such as power devices and the like, and having superior reliability with respect to thermal conductivity, strength, humidity, and thermal cycles, which are used in power modules for vehicles and the like.

(Second Viewpoint)

Regarding these problems, the second viewpoint of the present invention places importance, in addition to the heat dissipation characteristics which satisfies the market demand, in heat resistant cycle characteristics and impact strength characteristics necessary for the ceramics substrate. In terms of (1) heat dissipation characteristics, by using a boron nitride sintered body in which the primary particles of boron nitride are contacting and bonding with each other three-dimensionally, the high thermal conductivity as 400 W/(m·K) of the primary particles in the in-plane direction (direction in the a-axis) can be sufficiently utilized. In addition, orientation of the primary particles of boron nitride can be controlled in an arbitrary direction by the cutting direction when the resin-impregnated boron nitride sintered body is formed into plates, thereby realizing a heat dissipating member with superior thermal conductivity having arbitrary thickness. In terms of (2) heat resistant cycle characteristics, a resin composite can be obtained from boron nitride sintered body and resin, and the ratio (volume %) of the boron nitride and resin can be further controlled to supress the heat stress derived from the mismatch of the linear thermal expansion coefficient between the metal circuit and the resin-impregnated boron nitride sintered body when the circuit board is configured. In addition, since the Young's modulus of the boron nitride is smaller than that of silicon nitride, heat stress during the thermal cycle can be further suppressed, thereby realizing high reliability (prevention of delamination of metal circuit). In terms of (3) impact strength characteristics, a resin composite can be obtained from boron nitride sintered body and resin, and the area of the metal circuit can be further optimized, thereby preventing occurrence of cracks in the resin-impregnated boron nitride sintered body due to vibration or fall, and realizing high reliability (prevention of decrease in insulation characteristics) when the circuit board is configured. There has not been any technical suggestion to improve heat dissipation characteristics, heat resistant cycle characteristics, and impact strength characteristics from the afore-mentioned viewpoint.

An object of the second viewpoint of the present invention is to provide a heat dissipating member which is suitably used as a heat dissipating member of thermogenic electronic parts such as power devices and the like, and having superior heat dissipation characteristics, heat resistant cycle characteristics, and especially impact strength characteristics, which are used especially in power modules for vehicles and the like.

(Third Viewpoint)

Regarding these problems, in the third viewpoint of the present invention, the metal circuit and the metal heat dissipation plate are combined, rather than providing a metal circuit to the metal heat dissipation plate at the rear side of the boron nitride/resin composite circuit board. Accordingly, the afore-mentioned characteristics of the boron nitride sintered body is utilized and the effect of the expansion and contraction of the metal circuit and the metal heat dissipation plate can be eliminated completely. In addition, when a different metal is used for the metal circuit at one principal plane and the combined metal heat dissipation plate at the rear plane, suppression in weight and simplification in process can be realized. In addition, since the Young's modulus of boron nitride is smaller than that of silicon nitride, heat stress during the thermal cycle can be further suppressed, thereby realizing high reliability (prevention of delamination of metal circuit).

An object of the third viewpoint of the present invention is to provide a heat dissipating member which is suitably used as a heat dissipating member of thermogenic electronic parts such as power devices and the like, and having superior heat dissipation characteristics, heat resistant cycle characteristics, and impact strength characteristics, which are used especially in power modules for vehicles and the like.

Solution to Problem

In order to solve the afore-mentioned problems, the present invention adopts the following measures.

(First Viewpoint)

(1) A boron nitride/resin composite circuit board, comprising: a plate-shaped resin-impregnated boron nitride sintered body having a plate thickness of 0.2 to 1.5 mm, the plate-shaped resin-impregnated boron nitride sintered body comprising 30 to 85 volume % of a boron nitride sintered body having boron nitride particles bonded three-dimensionally, the boron nitride particles having an average long diameter of 5 to 50 µm, and 70 to 15 volume % of a resin; and a metal circuit adhered onto both principal planes of the plate-shaped resin-impregnated boron nitride sintered body, the metal circuit being copper, aluminum, or alloys thereof; wherein: a ratio of a linear thermal expansion coefficient in a plane direction of the resin-impregnated boron nitride sintered body at 40 to 150° C. (CTE1) and a linear thermal expansion coefficient of the metal circuit at 40 to 150° C. (CTE2) (CTE1/CTE2) is 0.5 to 2.0.

(2) The boron nitride/resin composite circuit board of (1), wherein a graphitization index (GI) of the resin-impregnated boron nitride sintered body by powder X-ray diffractometry is 4.0 or lower.

(3) The boron nitride/resin composite circuit board of (1) or (2), wherein a strength of the boron nitride/resin composite circuit board is 10 to 70 MPa, and a thermal conductivity in a plate thickness direction is 10 to 110 W/(m·K).

(4) The boron nitride/resin composite circuit board of any one of (1) to (3), wherein the resin is a thermosetting resin.

(5) The boron nitride/resin composite circuit board of any one of (1) to (4), wherein a plate thickness of the metal circuit is 0.05 to 1.5 mm.

(6) The boron nitride/resin composite circuit board of any one of (1) to (5), wherein an adhesion layer provided between the resin-impregnated boron nitride sintered body and the metal circuit is an epoxy-resin composition comprising an epoxy resin and an inorganic filler.

(7) A power module comprising the boron nitride/resin composite circuit board of any one of (1) to (6).

(Second Viewpoint)

(1) A boron nitride/resin composite circuit board, comprising: a plate-shaped resin-impregnated boron nitride sintered body having a plate thickness of 0.2 to 1.5 mm, the plate-shaped resin-impregnated boron nitride sintered body comprising 30 to 85 volume % of a boron nitride sintered body having boron nitride particles bonded three-dimensionally, the boron nitride particles having an average long diameter of 5 to 50 µm, and 70 to 15 volume % of a resin; and a metal circuit adhered onto both principal planes of the plate-shaped resin-impregnated boron nitride sintered body, the metal circuit being copper, aluminum, or alloys thereof; wherein: with respect to the metal circuit provided on at least one principal plane of the plate-shaped resin-impregnated boron nitride sintered body, a ratio of a projected area A/a projected area B is 1 or larger, the projected areas A and B being projected areas observed from a direction perpendicular to a principal plane of the plate-shaped resin-impregnated boron nitride sintered body, the projected area A being a projected area of a profile of the metal circuit, the projected area B being a projected area of a profile of the plate-shaped resin-impregnated boron nitride sintered body; and a ratio of a linear thermal expansion coefficient in a plane direction of the plate-shaped resin-impregnated boron nitride sintered body at 40 to 150° C. (CTE1) and a linear thermal expansion coefficient of the metal circuit at 40 to 150° C. (CTE2) (CTE1/CTE2) is 0.5 to 2.0.

(2) The boron nitride/resin composite circuit board of (1), wherein a graphitization index (GI) of the resin-impregnated boron nitride sintered body by powder X-ray diffractometry is 4.0 or lower.

(3) The boron nitride/resin composite circuit board of (1) or (2), wherein a plate thickness of the metal circuit is 0.05 to 1.5 mm.

(4) The boron nitride/resin composite circuit board of any one of (1) to (3), wherein a strength of the boron nitride/resin composite circuit board is 10 to 70 MPa, and a thermal conductivity in a plate thickness direction is 10 to 110 W/(m·K).

(5) The boron nitride/resin composite circuit board of any one of (1) to (4), wherein the resin is a thermosetting resin.

(6) The boron nitride/resin composite circuit board of any one of (1) to (5), wherein an adhesion layer provided between the resin-impregnated boron nitride sintered body and the metal circuit is an epoxy-resin composition comprising an epoxy resin and an inorganic filler.

(7) A power module comprising the boron nitride/resin composite circuit board of any one of (1) to (6).

(Third Viewpoint)

(1) A circuit board including boron nitride/resin composite integrated with heat dissipation plate, comprising: a resin-impregnated boron nitride sintered body comprising 30 to 85 volume % of a boron nitride sintered body having boron nitride particles bonded three-dimensionally, the boron nitride particles having an average long diameter of 5 to 50 μm, and 70 to 15 volume % of a resin; a metal circuit having a thickness of 0.03 to 3.0 mm formed onto one principal plane of the resin-impregnated boron nitride sintered body with an intermediary of an adhesion layer; and a metal heat dissipation plate having a thickness of 2.0 to 7.0 mm formed onto a rear surface of the resin-impregnated boron nitride sintered body with an intermediary of an adhesion layer.

(2) The circuit board including boron nitride/resin composite integrated with heat dissipation plate of (1), wherein the metal circuit and the metal heat dissipation plate comprises copper, aluminum, or an alloy thereof.

(3) The circuit board including boron nitride/resin composite integrated with heat dissipation plate of (1) or (2), wherein the metal circuit and the metal heat dissipation plate is a different metal.

(4) The circuit board including boron nitride/resin composite integrated with heat dissipation plate of any one of (1) to (3), wherein a thermal conductivity of the resin-impregnated boron nitride sintered body in a plate thickness direction is 20 W/mK or more, and a thermal coefficient of linear expansion in a plane direction in a temperature range of 25 to 200° C. is 12 to 30 ppm/K.

(5) A power module comprising the circuit board including boron nitride/resin composite integrated with heat dissipation plate of any one of (1) to (4).

Advantageous Effects of Invention

From the first viewpoint of the present invention, the effect of obtaining a circuit board having superior heat dissipation characteristics and heat resistant cycle characteristics can be achieved. From the second and third viewpoints of the present invention, the effect of obtaining a circuit board having superior heat dissipation characteristics, heat resistant cycle characteristics, and impact strength characteristics can be achieved.

DESCRIPTION OF EMBODIMENTS

Figure 1:
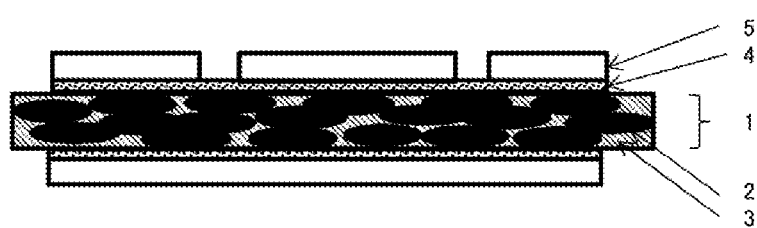
FIG. 1 is a simplified schematic diagram of the boron nitride/resin composite circuit board according to the first viewpoint of the present invention.
Figure 2:
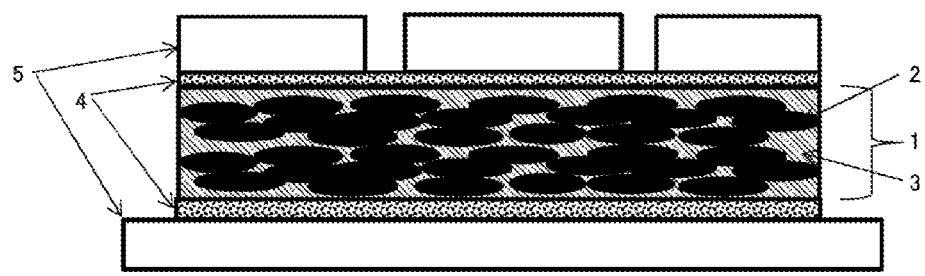
FIG. 2 is a cross-sectional view of the boron nitride/resin composite circuit board according to the second viewpoint of the present invention.
Figure 3:
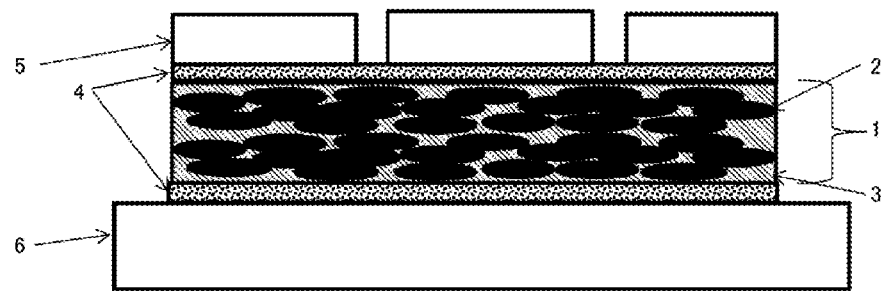
FIG. 3 is a cross-sectional view of the circuit board including boron nitride/resin composite integrated with heat dissipation plate according to the third viewpoint of the present invention.

Hereinafter, embodiments of the present invention will be described. The following explanation can be applied to any one of the first through the third viewpoints when the viewpoint to be applied is not explicitly provided.

In the present invention, "resin-impregnated boron nitride sintered body" is defined as a composite body comprising a boron nitride sintered body and a resin, and "boron nitride molded body" is defined as the mold obtained by calcifying the resin of the resin-impregnated boron nitride sintered body. The boron nitride molded body can be obtained by calcifying the resin component by calcinating the resin-impregnated boron nitride sintered body in the atmosphere at 650 to 1000° C. for 1 hour. Here, "boron nitride sintered body" is defined as a condition in which two or more of the primary particles are aggregated and are bonded by sinteration. The bond formed by the sinteration can be evaluated by observing the bonded portion between the primary particles at the cross-section of the boron nitride particles using a scanning type electronic microscope (for example, "JSM-6010LA" (available from JEOL Ltd.)). As a preliminary treatment before the observation, the boron nitride particles were embedded in a resin, followed by processing by CP (cross section polisher) method. Then, the particles were fixed on a sample stage, followed by osmium coating. Observation was carried out with a magnification of 1500.

The boron nitride sintered body of the present invention has a structure in which the boron nitride particles having an average long diameter of 5 to 50 μm are bonded three-dimensionally. In addition, the resin-impregnated boron nitride sintered body obtained by impregnating the resin into this boron nitride sintered body can be processed into a plate having a thickness of 0.2 to 1.5 mm. Accordingly, the present invention has first allowed to obtain a plate-shaped resin-impregnated boron nitride sintered body having superior thermal conductivity and strength which was not able to achieve by conventional techniques. The plate-shaped resin-impregnated boron nitride sintered body can suitably be used for the circuit board. There has not been a plate-shaped resin-impregnated boron nitride sintered body designed as shuck, and is an extremely important factor for retaining high thermal conductivity and high strength.

The major difference compared with the conventional technique is that the resin-impregnated boron nitride sintered body according to the present invention is structured with a boron nitride sintered body obtained as boron nitride particles bonded three-dimensionally by sintering. The three-dimensional bonding is not a simple contact which can be observed by SEM and the like, but can be evaluated by measuring the three-point bending strength and the thermal conductivity of the boron nitride molded body obtained by calcifying the resin component of the resin-impregnated boron nitride sintered body. In the conventional resin-impregnated boron nitride sintered body manufactured by mixing the boron nitride powder and the resin, the three-dimensional bond among the boron nitride is weak, and thus the boron nitride remaining after calcifying would be powdered and cannot maintain a shape, or cannot satisfy the required properties of the three-point bending strength and the thermal conductivity even when the shape is maintained.

<Average Long Diameter>

The average long diameter of the boron nitride particles in the resin-impregnated boron nitride sintered body is 5 to 50 µm. When the average long diameter is less than 5 µm, the pore size of the boron nitride molded body would become small, resulting in incomplete impregnation of the resin. Accordingly, although the strength of the boron nitride molded body itself can be improved, the effect of improving the strength by the resin would become small, and the strength as the resin-impregnated boron nitride sintered body would decrease. In addition, the number of contacting points among the flake-like boron nitride particles would increase, thereby resulting in decrease in the thermal conductivity of the resin-impregnated boron nitride sintered body. There is no particular limitation regarding the upper limit of the average long diameter. Since it is difficult for the flake-like boron nitride particles to have an average long diameter of 50 µm or more, upper limit of the average long diameter is approximately 50 µm in reality.

<Definition and Evaluation Method of Average Long Diameter>

The average long diameter can be measured in the following manner. As a preliminary treatment before the observation, the boron nitride sintered body is embedded in a resin, followed by processing by CP (cross section polisher) method. Then, the boron nitride sintered body was fixed on a sample stage, followed by osmium coating. Then, SEM image was taken with a scanning type electronic microscope (for example, "JSM-6010LA" (available from JEOL Ltd.)), and the image of the particles at the cross section was imported into an image analysis software, for example "A-ZO KUN" (available from Asahi Kasei Engineering Corporation). The magnification of the image was 100, and the pixel number of image analysis was $1510 \times 10^4$ pixel. Long diameter was manually measured for arbitrary 100 particles obtained, and the average value was taken as the average long diameter. Measurement was conducted with the boron nitride molded body in a similar manner.

<Ratio of Boron Nitride Sintered Body>

It is prefereable that the ratio of the boron nitride sintered body in the plate-shaped resin-impregnated boron nitride sintered body is 30 to 85 volume % (resin being 70 to 15 volume %). When the ratio of the boron nitride sintered body is lower than 30 volume %, the ratio of the resin having low thermal conductivity would increase, resulting in decrease in the thermal conductivity. When the ratio of the boron nitride sintered body is higher than 85 volume %, the pore size of the boron nitride molded body would become small, and thus the impregnation of the resin would become incomplete. Accordingly, although the strength of the boron nitride molded body itself can be improved, the effect of improving the strength by the resin would become small, and the strength as the resin-impregnated boron nitride sintered body would decrease. The ratio (volume %) of the boron nitride sintered body in the plate-shaped resin-impregnated boron nitride sintered body can be obtained by measuring the bulk density and the porosity of the boron nitride molded body as shown below. Here, it is assumed that all of the pores of the boron nitride molded body are filled with the resin, and the porosity of the boron nitride molded body is taken as the content of the resin in the resin-impregnated boron nitride sintered body (volume %).

bulk density ($D$) of boron nitride molded body=mass/volume porosity (volume %) of boron nitride molded body= $(1-(D/2.28)) \times 100$=ratio of resin ratio of boron nitride sintered body (volume %)=100–ratio of resin <Orientation Degree and Evaluation Method Thereof>

In order to decrease the anisotropy of the thermal conductivity with respect to the resin-impregnated boron nitride sintered body, it is necessary to decrease the orientation degree of the boron nitride crystals in the boron nitride sintered body. In the boron nitride sintered body of the present invention, the orientation degree represented by I.O.P (The Index of Orientation Performance) can be controlled by the formulation amount of the amorphous boron nitride powder and the hexagonal boron nitride powder particles as the raw material and by the molding method. I.O.P. of the boron nitride crystal can be calculated from the intensity ratio of Xray diffraction, the intensity ratio of (100) diffraction line with respect to (002) diffraction line measured from a direction parallel to the height direction of the sintered body and the intensity ratio of (100) diffraction line with respect to (002) diffraction line measured from a direction perpendicular to the height direction of the sintered body, using the following equation.

I.O.P=($I$100/$I$002)par./($I$100/$I$002)prep.

When I.O.P=1 is satisfied, it means that the direction of the boron nitride crystals in the sample are random. The value of I.O.P. being smaller than 1 indicates that the (100) plane of the boron nitride crystal in the boron nitride sintered body, that is, the a-axis of the boron nitride crystal is aligned perpendicularly with the height direction. On the other hand, the value of I.O.P. exceeding 1 indicates that the (100) plane of the boron nitride crystal in the boron nitride sintered body, that is, the a-axis of the boron nitride crystal is aligned parallel with the height direction. In general, I.O.P. of the boron nitride sintered body manufactured by conventional technique is 0.5 or less and 2 or more. Measurement of I.O.P can be conducted by using "D8ADVANCE Super Speed" (available from Bruker AXS K.K.) for example. Measurement was conducted using CuKα ray as the X-ray source, the X-ray tube voltage was 45 kV, and the X-ray tube current was 360 mA.

<Graphitization Index (GI)>

Graphitization index (GI) can be obtained from the following equation using the integrated intensity ratio, that is, the ratio of the peak area of (100) plane, (101) plane, and (102) plane of the X-ray diffraction diagram (J. Thomas, et. al, J. Am. Chem. Soc. 64, 4619 (1962)). GI=[area {(100)+ (101)}]/[area (102)]. Here, it is generally known that GI of fully crystallized boron nitride is 1.60. In the case of a flake-like hexagonal boron nitride powder having high crystallinity with sufficiently grown particles, GI becomes smaller since the particles tend to align. That is, GI is an index of the crystallinity of the flake-like hexagonal boron nitride powder, and the smaller the value, the higher the crystallinity. In the resin-impregnated boron nitride sintered body of the present invention, GI is preferably 4.0 or lower. The value of GI being higher than 4.0 indicates that the crystallinity of the boron nitride primary particle is low, and thus the thermal conductivity of the resin-impregnated boron nitride sintered body decreases. GI can be controlled by the formulation amount of the hexagonal boron nitride powder particles as the raw material, addition amount of calcium compound, and calcination temperature.

<Evaluation Method of Graphitization Index (GI)>

Measurement of GI can be conducted by using "D8 ADVANCE Super Speed" (available from Bruker AXS K.K.) for example. As a preliminary treatment before the measurement, the boron nitride sintered body is crushed using an agate mortar, and then the powder thus obtained was subjected to press molding. X-ray was irradiated symmetrically with respect to the normal vector of the plane in the in-plane direction of the mold. Measurement was conducted with CuKα ray as the X-ray source, the X-ray tube voltage was 45 kV, and the X-ray tube current was 360 mA.

<Strength>

Three-point bending strength is used as the strength of the resin-impregnated boron nitride sintered body of the present invention. The three-point bending strength is preferably 10 to 70 MPa. When the three-point bending strength is lower than 10 MPa, it can cause destruction of the heat dissipating material when the resin-impregnated boron nitride sintered body is mounted, resulting in decrease in the electric insulation characteristics and decrease in reliability. Regarding the upper limit, there is no problem related to the properties, however, the three-point bending strength being higher than 70 MPa indicates that the bonding area among the boron nitride particles is large, and thus the porosity of the sintered body decreases. Accordingly, it becomes difficult to allow the resin to fully impregnate into the inside of the boron nitride sintered body. As a result, the electric insulation characteristics of the resin-impregnated boron nitride sintered body decreases.

<Evaluation Method of Bending Strength>

The bending strength is measured under the conditions defined in JIS-R1601 at room temperature (25° C.). Here, "autograph AG2000D" available from Shimadzu Corporation can be used.

<Thermal Conductivity>

The thermal conductivity of the resin-impregnated boron nitride sintered body in the direction of plate thickness is 10 W/mK (preferably 20 W/mK) or more. When the thermal conductivity in the direction of plate thickness is less than 10 W/mK, the heat dissipation characteristics of the resulting boron nitride/resin composite circuit board is not sufficient, which is unfavorable. Regarding the upper limit of the thermal conductivity, there is no problem related to the properties, and is 110 W/mK for example. In order to increase the thermal conductivity of the composite body, it is necessary to increase the content of the boron nitride particle and to increase the bonding area of the boron nitride particles, thereby decreasing the porosity of the boron nitride sintered body. As a result, it becomes difficult to allow the resin to impregnate into the inside of the boron nitride sintered body when manufacturing the composite body, thereby decreasing the electric insulation characteristics of the resin-impregnated boron nitride sintered body.

<Evaluation Method of Thermal Conductivity>

Thermal conductivity (H: W/(m·K)) of resin-impregnated boron nitride sintered body was calculated from thermal diffusivity (A: m$^2$/sec), specific gravity (B: kg/m$^3$), and specific heat capacity (C: J/(kg·K)), by the equation of H=A×B×C. Thermal diffusivity was obtained by the laser flash method with a measuring sample prepared from resin-impregnated boron nitride sintered body having a width of 10 mm, length of 10 mm, and thickness of 1.0 mm. As the measuring apparatus, xenon flash analyzer ("LFA447 Nano Flash" available from NETZSCH Japan K.K.) was used. Specific gravity was obtained using the Archimedes method. Specific heat capacity was obtained using DSC ("ThermoPlus Evo DSC 8230" available from Rigaku Corporation).

<Purity of Boron Nitride and Evaluation Method Thereof>

In addition, the purity of boron nitride in the boron nitride sintered body of the present invention is preferably 95 mass % or higher. The purity of boron nitride can be measured by alkalinolysis of the boron nitride powder, followed by steam distillation using Kjeldahl method, and then measuring all of nitrogen contained in the distillate by neutralization titration.

<Definition of Average Grain Size of Boron Nitride Powder and Evaluation Method Thereof>

The average grain size of the boron nitride powder used as the starting material of the boron nitride-resin composite body is the grain size of accumulated value of 50% for accumulated particle distribution obtained in the particle size distribution measurement by the laser diffraction scattering method. As the size distribution measuring apparatus, "MT3300EX" (available from NIKKISO CO., LTD.) can be used. When the measurement was conducted, water was used as the solvent, hexametaphosphoric acid was used as the dispersant, and the boron nitride powder was dispersed using a homogenizer at 20 W output for 30 minutes as pretreatment. The refractive index of the water was taken as 1.33, and the refractive index of the boron nitride powder was taken as 1.80. The measurement period for one measurement was 30 seconds.

<Sintering Conditions of Boron Nitride Sintered Body>

In addition, it is preferable that the boron nitride sintered body of the present invention is manufactured by sinteration at 1600° C. or higher for 1 or more hours. When the sintering is not conducted, the pore size would be small, and it would be difficult to impregnate the resin. When the sintering temperature is lower than 1600° C., improvement in the crystallinity of the boron nitride would not be sufficient, and thus thermal conductivity of the resin-impregnated boron nitride sintered body may decrease. The upper limit of the sinteration temperature is not particularly limited, however, approximately 2200° C. is the practical upper limit in economic terms of view. When the sinteration period is shorter than 1 hour, improvement in the crystallinity of the boron nitride would not be sufficient, and thus thermal conductivity of boron nitride resin molded body may decrease. The upper limit of the sinteration period is not particularly limited, however, approximately 30 hours is the practical upper limit in economic terms of view. In addition, sinteration is preferably performed under nitrogen or herium or argon atmosphere in order to prevent oxidation of the boron nitride molded body.

<Programming Rate During Sinteration of Boron Nitride Molded Body>

Further, in the sintering process of the boron nitride molded body of the present invention, it is preferable that the programming rate in the temperature range of 300 to 600° C. is 40° C./min or lower. When the programming rate is higher than 40° C./min, rapid decomposition of the organic binder would cause a distribution in the sintering property of the boron nitride particles, thereby resulting in large variation in the properties and decrease in reliability. Although there is no particular limitation regarding the lower limit of the programming rate, a lower limit of approximately 5° C./min is practical, in economic terms of view.

<Plate-Shaped Resin-Impregnated Boron Nitride Sintered Body>

Next, the plate-shaped resin-impregnated boron nitride sintered body of the present invention will be described. The plate-shaped resin-impregnated boron nitride sintered body of the present invention can suitably be manufactured by allowing a resin to be impregnated into the boron nitride sintered body, thereby obtaining a cured resin-impregnated boron nitride sintered body, and then using an apparatus such as a multi wire saw and the like to cut out a plate-shaped resin-impregnated boron nitride sintered body having an arbitrary thickness. The resin can be impregnated by vacuum impregnation, pressurized impregnation at 1 to 300 MPa, heated impregnation at r.t. to 300° C., or combination thereof. The pressure during the vacuum impregnation is preferably 1000 Pa or lower, and more preferably 100 Pa or lower. With respect to pressurized impregnation, the resin would not sufficiently impregnate into the boron nitride sintered body when the pressure is lower than 1 MPa. On the other hand, when the pressure is 300 MPa or higher, the facility would become large, raising the cost. In heated impregnation, the resin capable of being impregnated under room temperature is limited, and the resin cannot sufficiently be impregnated into the boron nitride sintered body. On the other hand, when the impregnation is performed at 300° C. or higher, further heat resistance needs to be provided with the facility, thereby being disadvantageous in terms of cost. By using a processing apparatus such as the multi wire saw and the like, the resin-impregnated boron nitride sintered body can be cut out with arbitrary thickness by mass amount, and the surface roughness after cutting would show a favorable value. In addition, by altering the direction of the resin-impregnated boron nitride sintered body when the cutting is conducted, a plate-shaped resin-impregnated boron nitride sintered body having superior thermal conductivity with respect to an arbitrary direction can be easily obtained.

<Plate Thickness>

The plate thickness of the plate-shaped resin-impregnated boron nitride sintered body is preferably 0.2 to 1.5 mm, and more preferably 0.2 to 0.7 mm. When the plate thickness is less than 0.2 mm, the dielectric voltage of the plate-shaped resin-impregnated boron nitride sintered body can decrease and thus may not be preferable when used as a circuit board. In addition, breakage due to decrease in strength can be problematic. On the other hand, when the plate thickness exceeds 1.5 mm, the thermal resistance in the direction of plate thickness can become too large, and is not preferable since the heat dissipation characteristics as the circuit board decreases.

<Composite with Resin>

Next, the method for obtaining a composite of boron nitride sintered body and resin according to the present invention will be explained. The resin-impregnated boron nitride sintered body of the present invention is suitably manufactured by impregnating a resin into the boron nitride sintered body followed by curing. The resin can be impregnated by vacuum impregnation, pressurized impregnation at 1 to 300 MPa (preferably 3 to 300 MPa), heated impregnation at r.t. to 300° C., or combination thereof. The pressure during the vacuum impregnation is preferably 1000 Pa or lower, and more preferably 100 Pa or lower. With respect to pressurized impregnation, the resin would not sufficiently impregnate into the boron nitride sintered body when the pressure is 1 MPa or lower. On the other hand, when the pressure is 300 MPa or higher, the facility would become large, raising the cost. By decreasing the viscosity of the resin, the resin can be impregnated into the boron nitride sintered body. Therefore, it is further preferable to raise the temperature to a temperature range of 30 to 300° C. and decrease the viscosity of the resin when pressure is applied.

<Resin>

As the resin, epoxy resin, silicone resin, silicone rubber, acrylic resin, phenolic resin, melamine resin, urea resin, unsaturated polyester, fluorine resin, polyamide such as polyimide, polyamide imide, polyether imide and the like, polyester such as polybutylene terephthalate, polyethylene terephthalate and the like, polyphenylene ether, polyphenylene sulfide, fully aromatic polyester, polysulfone, liquid crystal polymer, polyether sulfone, polycarbonate, modified maleimide resin, ABS resin, AAS (acrylonitrile-acryl rubber.styrene) resin, AES (acrylonitrile.ethylene.propylene-.dine rubber-styrene) resin, polyglycolic acid resin, poly phthalamide, polyacetal and the like can be used for example. In particular, epoxy resin is suitable as the insulating layer of a printed-wiring board since its heat resistance and adhesion strength with respect to a copper foil circuit are superior. In addition, silicone resin is suitable as the thermal interface materials since heat resistance, flexibility and adhesion property with respect to a heat sink and the like are superior. These resins, especially thermosetting resin can contain curing agent, inorganic fillers, silane coupling agent, and further an additive to enhance the improvement in the wettability and leveling property and decrease in the viscosity, thereby decreasing occurrence of defects during hot-press molding. As the additive, for example, antifoaming agent, surface conditioner, wetting-and-dispersing agent and the like can be mentioned. In addition, it is further preferable that the resin contains one or more kinds of a ceramics powder selected from the group consisting of aluminum oxide, silicon oxide, zinc oxide, silicon nitride, aluminum nitride, and aluminum hydroxide. The ceramics powder can be filled in between the boron nitride particles, thereby allowing improvement of the thermal conductivity of the resin-impregnated boron nitride sintered body. The resin and the ceramics powder containing resin can be diluted with a solvent as necessary. As the solvent, alcohols such as ethanol, isopropanol and the like, ether alcohols such as 2-methoxyethanol, 1-methoxyethanol, 2-ethoxyethanol, 1-ethoxy-2-propanol, 2-butoxyethanol, 2-(2-methoxyethoxy)ethanol, 2-(2-ethoxyethoxy)ethanol, 2-(2-butoxyethoxy)ethanol and the like, glycol ethers such as ethylene glycol monomethyl ether, ethylene glycol monobutyl ether and the like, ketones such as acetone, methyl ethyl ketone, methyl isobutyl ketone, di-isobutyl ketone and the like, hydrocarbons such as toluene, xylene and the like can be mentioned for example. Here, these diluents can be used alone or two or more kinds can be used in combination.

<Metal Circuit>

As the metal circuit material, copper, aluminum, or alloys thereof are preferable in terms of electrical conductivity and thermal conductivity. When only the aspects of characteristics are taken into consideration, silver, gold and the like can be used, however, they are problematic in terms of cost and in the following process of circuit formation. In addition, the thickness of the metal circuit is preferably 0.03 to 3.0 mm, and more preferably 0.05 to 1.5 mm. When the plate thickness is less than 0.03 mm, it is not preferable since sufficient electrical conductivity cannot be obtained and the metal circuit portion can generate heat when used as the circuit board for power module, which can be problematic. On the other hand, when the plate thickness exceeds 3.0 mm, it is not preferable since the thermal resistance of the metal circuit itself becomes large, and the heat dissipation characteristics of the circuit board decreases.

<Thermal Coefficient of Linear Expansion>

The ratio of the linear thermal expansion coefficient in the plane direction of the resin-impregnated boron nitride sintered body at 40 to 150° C. (CTE1) and the linear thermal expansion coefficient of the metal circuit at 40 to 150° C. (CTE2) (CTE1/CTE2) is preferably 0.5 to 2.0. When CTE1/CTE2 is less than 0.5 or exceeds 2.0, the thermal cycle due to the operation of the semiconductor devices would result in excessive increase in the heat stress generated by the difference in the linear thermal expansion of the resin-impregnated boron nitride sintered body and the metal circuit, when used as the circuit board. Then, the metal circuit can delaminate, or the resin-impregnated boron nitride sintered body can break, causing problems such as decrease in the withstand voltage characteristics.

<Method for Evaluating Thermal Coefficient of Linear Expansion>

The linear thermal expansion coefficient of the resin-impregnated boron nitride sintered body and the metal circuit can be measured by processing the measurement material into the size of 3×2×10 mm, and then measuring the linear thermal expansion coefficient using TMA300 (available from Seiko Instruments Inc.) in a temperature range of 40 to 150° C. at a programming rate of 1° C./min.

<Circuit Shape>

Regarding the shape of the circuit board, it is preferable that with respect to the metal circuit provided on at least one principal plane of the plate-shaped resin-impregnated boron nitride sintered body, a ratio of a projected area A/a projected area B is 1 or larger, the projected areas A and B being projected areas observed from a direction perpendicular to a principal plane of the plate-shaped resin-impregnated boron nitride sintered body, the projected area A being a projected area of a profile of the metal circuit, the projected area B being a projected area of a profile of the plate-shaped resin-impregnated boron nitride sintered body. The strength of the plate-shaped resin-impregnated boron nitride sintered body itself is improved up to 10 to 70 MPa by the reinforcing effect obtained by forming a composite with the boron nitride sintered body and the resin. However, impact resistance characteristics (resistance against cracks generated by impact due to vibration or fall) required when used as a power module by mounting electronic parts as a circuit board are becoming severe year by year, and thus further improvement in strength is required to achieve such requirement. Such problem can be solved by the reinforcing effect of the metal circuit, which is achieved when with respect to the metal circuit provided on at least one principal plane of the plate-shaped resin-impregnated boron nitride sintered body, a ratio of a projected area A/a projected area B is 1 or larger, the projected areas A and B being projected areas observed from a direction perpendicular to a principal plane of the plate-shaped resin-impregnated boron nitride sintered body, the projected area A being a projected area of a profile of the metal circuit, the projected area B being a projected area of a profile of the plate-shaped resin-impregnated boron nitride sintered body. In addition, it is also preferable that A/B is 1 or larger in terms of heat dissipation characteristics. Further, it is preferable that A/B is 1 in terms of manufacturing conditions.

<Adhesion Layer>

In order to adhere the metal circuit to the resin-impregnated boron nitride sintered body, an epoxy-resin or an epoxy resin composition comprising an epoxy resin and an inorganic filler is coated onto both or either one of the metal circuit and the resin-impregnated boron nitride sintered body, followed by lamination of the metal circuit and heat pressing to allow curing, thereby obtaining the boron nitride/resin composite circuit board. In order to cure the epoxy-resin, a curing agent and a curing accelerator are usually used. Here, when the metal circuit and the resin-impregnated boron nitride sintered body are adhered, an epoxy-resin sheet is used. Here, the epoxy-resin sheet is prepared by forming a sheet epoxy-resin composition using a coater of any kind, followed by curing the sheet epoxy-resin composition to a desired curing degree. Here, the desired degree of curing is a semi-cured condition in which the epoxy-resin sheet can express adhesion property by fusion when heated. The epoxy-resin sheet is cut into an appropriate size, and is then placed in between the circuit material and the resin-impregnated boron nitride sintered body, followed by hot press for curing. Accordingly, the boron nitride/resin composite circuit board is obtained.

The thickness of the epoxy-resin composition used for adhesion is 100 μm or less in terms of reducing thermal resistance, more preferably 50 μm or less, and further more preferably 10 μm or less. There is no limitation regarding the lower limit, however, 0.5 μm or more is the practical limit when the variation of the thickness during formation of the adhesion layer into a form of a sheet is taken into consideration.

As the epoxy resin, a bisphenol A epoxy resin, a bisphenol S epoxy resin, a bisphenol F epoxy resin, a hydrogenated bisphenol A epoxy resin, a polypropylene glycol-based epoxy resin, a polytetramethylene glycol-based epoxy resin, a naphthalene-based epoxy resin, a phenyl metane-based epoxy resin, a tetrakis phenol methane-based epoxy resin, a biphenyl-based epoxy resin, an epoxy resin having a triazine structure, and a bisphenol A alkylene oxide adduct-based epoxy resin can be mentioned. A combination of these can also be used. Here, the epoxy resin mentioned in the present specification refers to a prepolymer before being cured, including un-reacted epoxy group which can react with the curing agent described hereinafter.

As the curing agent, one or more resin selected from the group consisting of an amine-based resin, an acid anhydride-based resin, and a phenolic resin. The reactivity of the phenolic resin with the epoxy resin is generally low. Accordingly, it is preferable since the increase in the viscosity of the coating solution due to the reaction is low even when the time after mixing the resin with the epoxy resin before coating becomes long.

As the phenolic resin, a phenolic resin having at least two phenolic hydroxyl groups in a molecule is used. Specific examples of such curing agent are novolac resins such as phenolic novolac resin and cresol novolac resin, paraxylene modified novolac resin, metaxylene modified novolac resin, orthoxylene modified novolac resin, bisphenyl resin such as bisphenol A and bisphenol F, phenolic resins such as biphenyl-based phenolic resin, resol-based phenolic resin, phenol aralkyl resin, aralkyl-based phenolic resin having biphenyl structure, triphenol alkane-based resin and polymers thereof, phenolic resin containing naphthalene ring, dicyclopentadiene modified phenolic resin, alicyclic phenolic resin, heterocyclic phenolic resin and the like can be mentioned. Any of these phenolic resins can be used.

As the curing accelerator for example, organic phosphine compounds, specifically for example primary, secondary, and tertiary organophosphine compounds such as alkyl phosphine, dialkyl phosphine, trialkyl phosphine, phenyl phosphine, diphenyl phosphine, triphenyl phosphine and the like, phosphino alkane compounds such as (diphenylphosphino) methane, 1,2-bis(diphenylphosphino) ethane, 1,4-(diphenylphosphino) butane and the like, diphosphine compounds such as triphenyl diphosphine and the like, salts of triorganophosphines and triorganoboranes such as triphenyl phosphine-triphenyl borane and the like, salts of tetraorganophosphoniums and tetraorganoborates such as tetraphenyl phosphonium.tetraphenyl borate and the like, can be mentioned. In addition, as the nitrogen containing heterocyclic compounds, specifically for example, 2-methyl imidazole, 2-ethyl imidazole, 2-undecyl imidazole, 2,4-dimethyl imidazole, 2-heptadecyl imidazole, 1,2-dimethyl imidazole, 1,2-diethyl imidazole, 2-phenyl-4-methyl imidazole, 2,4,5-triphenyl imidazole, 2-ethyl-4-methyl imidazole, 2-phenyl imidazole, 1-benzyl-2-phenyl imidazole, 1-cyanoethyl-2-methyl imidazole, 1-cyanoethyl-2-undecyl imidazole, 1-benzyl-2-methyl imidazole, 2-phenyl-4, 5-dihydroxymethyl imidazole, 2-aryl-4,5-diphenyl imidazole, 2,4-diamino-6-[2'-methylimidazolyl-(1)' ]-ethyl-S-triazine, 2,4-diamino-6-[2'-ethyl-4'-methylimidazolyl-(1)' ]-ethyl-S-triazine, isocyanuric acid adduct of 2,4-diamino-6-[2'-methylimidazolyl-(1)' ]-ethyl-S-triazine, 2-phenyl-4-methyl-5-hydroxymethyl imidazole and the like can be mentioned.

As the inorganic filler, there is no limitation so long as it has superior thermal conductivity. As a such substance for example, silicon oxide, aluminum oxide, aluminum nitride, boron nitride, crystalline silica, silicon nitride diamond and the like as inorganic fillers having insulation characteristics; and silver, aluminum, copper, alloys thereof, graphite and the like as inorganic fillers having conductive characteristics can be mentioned.

<Formation of Circuit>

In the boron nitride/resin composite circuit board of the present invention, an etching resist is coated onto the metal layer for forming the metal circuit, followed by etching, thereby forming the circuit pattern. There is no particular limitation regarding the etching resist, and for example, generally used UV ray-curing type or a thermosetting type can be used. There is no particular limitation regarding the coating method of the etching resist, and for example, a known coating method such as a screen printing method can be adopted. In order to form the circuit pattern, an etching process is applied to the metal layer for forming the metal circuit. When copper is used for the metal circuit and the metal heat dissipation plate, there is no particular limitation regarding the type of the etching solution. Here, generally used ferric chloride solution, cupric chloride solution, sulphuric acid solution, hydrogen peroxide solution and the like can be used. As a preferable example, ferric chloride solution and cupric chloride solution can be mentioned. When aluminum is used for the metal circuit and the metal heat dissipation plate, the etching solution is preferably an alkali solution such as a sodium hydroxide solution. Here, when copper is used for the metal circuit and aluminum is used for the metal heat dissipation plate, sulphuric acid-hydrogen peroxide solution is preferable as the selective etching solution. When aluminum is used for the metal circuit and copper is used for the metal heat dissipation plate, selective etching can be performed with a sodium hydroxide solution, thereby achieving simplification in the process. After forming the circuit, delamination of the etching resist is conducted. Here, when copper is used for the metal circuit, general method of delamination is immersion into alkali aqueous solution. When aluminum is used for the metal circuit, a method of immersion into a weak acid aqueous solution can be mentioned. In addition, the circuit pattern can also be formed by adhering a metal circuit processed into a pattern shape beforehand onto the resin-impregnated boron nitride sintered body.

<Plating>

In the boron nitride/resin composite circuit board of the present invention, a plating film is formed onto the metal circuit as necessary. There is no limitation regarding the plating material, and nickel plating is generally used. As the plating method, electroless plating, electroplating and the like can be adopted. Further, metal film can be formed by deposition, sputtering, thermal spraying and the like. In addition, solder resist is coated onto the metal circuit as necessary.

<Dielectric Voltage and Evaluation Method Thereof>

The dielectric voltage of the boron nitride/resin composite circuit board according to the present invention is 15 kV/mm or higher. When the dielectric voltage is lower than 15 kV/mm, it is unfavorable since sufficient dielectric voltage required for usage as the circuit board cannot be obtained. The dielectric voltage is measured by preparing the circuit board, using a withstand voltage tester under AC voltage.

<Heat Resistant Cycle Characteristics and Evaluation Method Thereof>

The boron nitride/resin composite circuit board of the present invention is superior in heat resistant cycle characteristics, and is suitable for usage as a circuit board for a power module and the like. Specifically, in a heat resistant cycle test performed with a cycle of −40° C. for 30 minutes, 25° C. for 10 minutes, 150° C. for 30 minutes, and 25° C. for 10 minutes, delamination of metal circuit and breakage in the resin-impregnated boron nitride sintered body was hardly observed even after repeating the cycle for 1000 times.

<Combined Substrate of Resin-Impregnated Boron Nitride Composite Body and Heat Dissipation Plate>

In the third viewpoint of the present invention, the metal circuit is formed onto one principal plane of the resin-impregnated boron nitride sintered body with an intermediary of an adhesion layer, and a metal heat dissipation plate is formed onto the rear surface of the resin-impregnated boron nitride sintered body with an intermediary of an adhesion layer, thereby providing a circuit board. Such circuit board is referred to as the combined substrate of resin-impregnated boron nitride composite body and heat dissipation plate. As a large difference from the conventional technique, the combined substrate of resin-impregnated boron nitride composite body and heat dissipation plate of the present invention provides the resin-impregnated boron nitride sintered body which is an insulating layer onto the metal circuit, and the metal heat dissipation plate for heat dissipation is provided directly onto the rear surface (opposite surface) of the insulating layer having the metal circuit, without providing the metal circuit.

Figure 4:
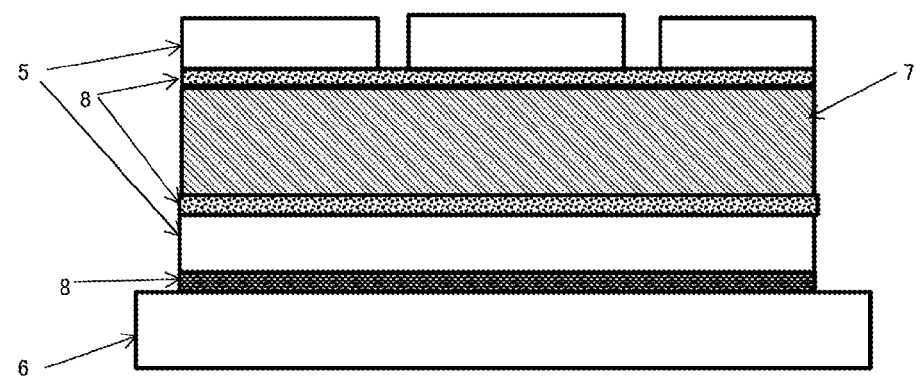
FIG. 4 is a cross section of an aluminum nitride substrate or a silicon nitride substrate.

In the combined substrate of resin-impregnated boron nitride composite body and heat dissipation plate of the third viewpoint according to the present invention, when compared with the aluminum nitride substrate or the silicon nitride substrate as shown in FIG. 4, there is no adhesion layer or a brazing material joining portion such as a silver paste and the like. Accordingly, cracks due to the difference in the linear expansion coefficient of the adhesion layer or the brazing material joining portion such as a silver paste and the like and the metal circuit or the metal heat dissipation plate do not occur, thereby achieving high heat dissipation characteristics for a long period. In addition, thickness of the entire substrate can be made thin for the thickness of the metal circuit and the adhesion layer or the brazing material joining portion such as a silver paste and the like provided at the rear surface.

<Metal Circuit•Metal Heat Dissipation Plate>

As the material for the metal circuit and the metal heat dissipation plate, copper, aluminum, or alloys thereof are preferable in terms of electrical conductivity and thermal conductivity. When only the aspects of characteristics are taken into consideration, silver, gold and the like can be used, however, they are problematic in terms of cost and in the following process of circuit formation. In addition, it is preferable that different metals are used for the metal circuit and the metal heat dissipation plate. This is for allowing selective etching of copper or aluminum by selecting the etching solution regarding a case where the material contains both of copper and aluminum, thereby achieving simplification of the process. In addition, when aluminum is used for the metal heat dissipation plate, the weight can be reduced, thereby allowing suppression in electricity consumption and $CO_2$ emission when installed in elevators, vehicles and the like.

<Shape and Thickness of Metal Heat Dissipation Plate>

Regarding the shape of the resin-impregnated boron nitride composite body circuit board, it is preferable that with respect to the metal heat dissipation plate provided on one principal plane of the plate-shaped resin-impregnated boron nitride sintered body, a ratio of a projected area $S_M$/a projected area $S_{BN}$ is 1 or larger, the projected areas $S_M$ and $S_{BN}$ being projected areas observed from a direction perpendicular to the principal plane of the plate-shaped resin-impregnated boron nitride sintered body, the projected area $S_M$ being a projected area of a profile of the metal heat dissipation plate, the projected area $S_{BN}$ being a projected area of a profile of the plate-shaped resin-impregnated boron nitride sintered body. When this value is smaller than 1, the thermal resistance of the entire metal circuit board becomes large and the heat dissipation characteristics degrades, which is unfavorable. In addition, the strength of the plate-shaped resin-impregnated boron nitride sintered body itself is improved up to 10 to 70 MPa by the reinforcing effect obtained by forming a composite with the boron nitride sintered body and the resin. However, impact resistance characteristics (resistance against cracks generated by impact due to vibration or fall) required when used as a power module by mounting electronic parts as a circuit board are becoming severe year by year, and thus further improvement in strength is required to achieve such requirement. Such problem can be solved by the reinforcing effect of the metal heat dissipation plate, by allowing the ratio ($S_M/S_{BN}$) to be 1 or larger.

The thickness of the metal heat dissipation plate is preferably 2.0 to 7.0 mm. When the thickness of the metal heat dissipation plate is less than 2.0 mm, the hardness would be low and the strength as the metal heat dissipation plate would be insufficient, thereby raising a problem in that the metal heat dissipation plate can be deformed during the parts mounting process and the like. When the thickness of the metal heat dissipation plate exceeds 7.0 mm, cracks occur by the heat stress due to the heat cycle, thereby raising a problem of insulation breakdown.

<Thermal Coefficient of Linear Expansion>

In the third viewpoint of the present invention, the linear thermal expansion coefficient of the resin-impregnated boron nitride sintered body in the plane direction at 25 to 200° C. is preferably 12 to 30 ppm. When the linear thermal expansion coefficient is not in the range of 12 to 30 ppm, heat stress is generated due to the difference in the linear thermal expansion coefficient between the metal circuit and the resin-impregnated boron nitride sintered body, and between the resin-impregnated boron nitride sintered body and the metal heat dissipation plate. Accordingly, reliability as the circuit board is decreased. In addition, when the linear thermal expansion coefficient is 30 ppm or higher, the ratio of the resin having low thermal conductivity would be high, thereby resulting in decrease in the thermal characteristics. When the linear thermal expansion coefficient is 12 ppm or lower, the effect of improvement in strength by the resin cannot be achieved, thereby resulting in decrease in strength of the resin-impregnated boron nitride sintered body.

<Evaluation Method of Thermal Coefficient of Linear Expansion>

The linear thermal expansion coefficient of the resin-impregnated boron nitride sintered body, the metal circuit, and the metal heat dissipation plate were measured by processing the measurement material into the size of 3×2×10 mm, and then measuring the linear thermal expansion coefficient using TMA300 (available from Seiko Instruments Inc.) in a temperature range of 25 to 200° C. at a programming rate of 1° C./min.

EXAMPLES

First Viewpoint

Hereinafter, the first viewpoint of the present invention will be described further specifically referring to Examples and Comparative Examples.

<Preparation of Boron Nitride Sintered Body 1>

Amorphous boron nitride powder (oxygen content of 1.5%, boron nitride purity of 97.6%, average grain size of 0.3 μm, 0.5 μm, 2.0 μm, and 6.0 μm), hexagonal boron nitride powder (oxygen content of 0.3%, boron nitride purity of 99.0%, average grain size of 2.0 μm, 3.0 μm, 10.0 μm, 18.0 μm, and 30.0 μm), and calcium carbonate ("PC-700" available from Shiraishi Kogyo Kaisha, Ltd.) were mixed using a conventional technique to give a mixed powder. Subsequently, the mixed powder for molding was used to conduct press molding at 5 MPa to give a block molded body. The block molded body thus obtained was subjected to a treatment by cold isotropic pressing method (CIP) in the range of 0.1 to 100 MPa, followed by sinteration in a batch-type high-frequency furnace with a nitrogen flow of 10 L/min. Accordingly, 8 kinds of boron nitride sintered bodies (sinteration was not conducted in condition 1F) as shown in Table 1-1 were obtained.

TABLE 1-1

| Conditions | Average Grain Size of Boron Nitride Powder (μm) | | Formulation Ratio (mass %) | | Calcination Temperature (° C.) | CIP Pressure (MPa) |
|---|---|---|---|---|---|---|
| | Amorphous Boron Nitride | Hexagonal Boron Nitride | Amorphous Boron Nitride | Hexagonal Boron Nitride | | |
| 1A | 6.0 | 18.0 | 40 | 60 | 2050 | 100 |
| 1B | 6.0 | 18.0 | 40 | 60 | 2050 | 10 |
| 1C | 6.0 | 30.0 | 40 | 60 | 2150 | 100 |
| 1D | 2.0 | 10.0 | 60 | 40 | 2050 | 100 (×100 times) |
| 1E | 0.5 | 3.0 | 40 | 60 | 1950 | 100 |
| 1F | 6.0 | 18.0 | 40 | 60 | — | 100 |
| 1G | 6.0 | 18.0 | 40 | 60 | 2050 | 0.1 |
| 1H | 0.3 | 2.0 | 60 | 40 | 1950 | 10 |

Vacuum Impregnation of Epoxy Resin

Examples 1-1 to 1-10 and Comparative Examples 1-1 to 1-5

The resin was impregnated into the boron nitride sintered body thus obtained. The boron nitride sintered body and a mixture of epoxy resin ("bond E205" available from Konishi Co., Ltd) with an attached curing agent were degassed under vacuum of 100 Pa for 10 minutes, and the mixture was then poured into the boron nitride sintered body under vacuum, followed by impregnation for 20 minutes. Subsequently, the resin was cured by heating at 150° C. for 60 minutes, thereby obtaining the resin-impregnated boron nitride sintered body. <Preparation of Plate-Shaped Resin-Impregnated Sintered Body>
To evaluate the characteristics of the resin-impregnated boron nitride sintered body obtained as the heat dissipating member, the resin-impregnated boron nitride sintered body was processed into an arbitrary shape using a multi wire saw or a machining center. Here, the resin-impregnated boron nitride sintered body was cut out so that the 100 plane (a-axis) or the 002 plane (c-axis) would align with respect to the thickness direction. In addition, the evaluation result of the resin-impregnated boron nitride sintered body thus obtained is shown in Table 1-2.

TABLE 1-2

Resin-impregnated Boron Nitride Sintered Body

| | Conditions | Resin | Boron Nitride (volume %) | Resin (volume %) | Average Long Diameter of Boron Nitride (μm) | I. O. P | GI | Thermal Conductivity in Thickness Direction W/(m · K) | Thermal Conductivity in Plane Direction W/(m · K) | Bending Strength (MPa) | Linear Thermal Expansion Coefficient in Plane Direction (CTE1) (ppm/k) | Plate Thickness (mm) | Alignment During Processing |
|---|---|---|---|---|---|---|---|---|---|---|---|---|---|
| Example 1-1 | 1A | epoxy | 67 | 33 | 20 | 24 | 1.1 | 32 | 94 | 67 | 15 | 0.32 | 002 plane |
| Example 1-2 | 1A | epoxy | 67 | 33 | 20 | 24 | 1.1 | 32 | 94 | 67 | 15 | 0.32 | 002 plane |
| Example 1-3 | 1A | epoxy | 67 | 33 | 20 | 24 | 1.1 | 32 | 94 | 67 | 15 | 0.32 | 002 plane |
| Example 1-4 | 1A | epoxy | 67 | 33 | 20 | 24 | 1.1 | 32 | 94 | 67 | 15 | 0.32 | 002 plane |
| Example 1-5 | 1A | epoxy | 67 | 33 | 20 | 24 | 1.1 | 32 | 94 | 67 | 15 | 0.20 | 002 plane |
| Example 1-6 | 1A | epoxy | 67 | 33 | 20 | 24 | 1.1 | 32 | 94 | 67 | 15 | 1.50 | 002 plane |
| Example 1-7 | 1B | epoxy | 30 | 70 | 18 | 50 | 1.1 | 12 | 52 | 45 | 34 | 0.32 | 002 plane |
| Example 1-8 | 1C | epoxy | 65 | 35 | 50 | 77 | 0.8 | 36 | 110 | 60 | 16 | 0.32 | 002 plane |
| Example 1-9 | 1D | epoxy | 85 | 15 | 15 | 82 | 1.0 | 40 | 108 | 55 | 8.5 | 0.32 | 002 plane |
| Example 1-10 | 1E | epoxy | 65 | 35 | 5 | 19 | 4.0 | 30 | 85 | 70 | 17 | 0.32 | 002 plane |
| Comparative Example 1-1 | 1A | epoxy | 67 | 33 | 20 | 0.04 | 1.1 | 94 | 32 | 26 | 80 | 0.32 | 100 plane |
| Comparative Example 1-2 | 1F | epoxy | 65 | 35 | 13 | 26 | 4.2 | 8 | 7 | 50 | 35 | 0.32 | 002 plane |
| Comparative Example 1-3 | 1G | epoxy | 20 | 80 | 20 | 24 | 1.1 | 8 | 20 | 8 | 45 | 0.32 | 002 plane |
| Comparative Example 1-4 | 1H | epoxy | 45 | 55 | 2 | 15 | 5.0 | 15 | 50 | 65 | 35 | 0.32 | 002 plane |

Circuit Formation, Plating

Example 1-1, Examples 1-2 to 1-10, and Comparative Examples 1-1 to 1-5

To the plate-shaped resin-impregnated boron nitride sintered body thus obtained, an epoxy resin composition (A) obtained by mixing 100 parts by mass of epoxy resin ("ep828" available from Mitsubishi Chemical Corporation), parts by mass of curing agent ("VH-4150" available from DIC Corporation), 3 parts by mass of curing accelerator ("TPP" available from HOKKO CHEMICAL INDUSTRY CO., LTD.), and 500 parts by mass of alumina ("AKP-20" available from Sumitomo Chemical Company, Limited) as the inorganic filler using a planetary mixer for 15 minutes was coated onto both principal planes of the plate-shaped resin-impregnated boron nitride sintered body with a thickness of 10 μm as the adhesion layer. Then, hot press adhesion was performed with the metal circuit as shown in Table 1-3 with a surface pressure of 1 MPa at 180° C. for 3 hours, thereby obtaining a composite body having the metal circuit adhered on both principal planes. The composite body having metal circuit adhered thereon is further subjected to circuit pattern printing onto the surface of the metal circuit. Subsequently, circuit was formed by etching using an etching solution containing copper chloride, followed by formation of the metal layer as shown in Table 1-3 onto the surface of the metal by plating treatment. Accordingly, the boron nitride/resin composite circuit board was prepared.

Circuit Formation, Plating

Example 1-1a

Circuit was formed in a similar manner as Example 1-1, except that epoxy-resin composition (A) was formed as the adhesion layer onto the plate-shaped resin-impregnated boron nitride sintered body obtained with a thickness of 5 μm.

Circuit Formation, Plating

Example 1-1b

Circuit board was formed in a similar manner as Example 1-1, except that an epoxy-resin composition (B) was prepared by using spherical alumina "DAW-05" (available from Denka Company Limited) as the inorganic filler, and was coated onto the plate-shaped resin-impregnated boron nitride sintered body obtained with a thickness of 20 μm.

Circuit Formation, Plating

Example 1-1c

Circuit board was formed in a similar manner as Example 1-1, except that an epoxy-resin composition (C) was prepared by using spherical alumina "DAW-07" (available from Denka Company Limited) as the inorganic filler, and was coated onto the plate-shaped resin-impregnated boron nitride sintered body obtained with a thickness of 50 μm.

Circuit Formation, Plating

Example 1-1d

Circuit board was formed in a similar manner as Example 1-1, except that an epoxy-resin composition (D) was prepared by using spherical alumina "DAW-45" (available from Denka Company Limited) as the inorganic filler, and was coated onto the plate-shaped resin-impregnated boron nitride sintered body obtained with a thickness of 100 μm.

<Evaluation of Dielectric Voltage and Heat Resistant Cycle Characteristics>

With the boron nitride/resin composite circuit board obtained, dielectric voltage at alternating current was measured using a withstand voltage tester. Then, the boron nitride/resin composite circuit board was subjected to heat resistant cycle test performed by repeating the cycle of −40° C. for 30 minutes and 125° C. for 30 minutes for 1000 times, followed by observation of appearance and the adhesion conditions of the metal circuit using an ultrasonic test equipment. The results of evaluation of the boron nitride/resin composite circuit board are shown in Table 1-3.

TABLE 1-3

| | | Boron Nitride/Resin Composite Circuit Board | | | | | | | |
|---|---|---|---|---|---|---|---|---|---|
| | Adhesion Layer | Thickness of Adhesion Layer (μm) | Metal Circuit | Thickness of Metal Circuit (mm) | CTE1/CTE2 | Plating (μm) | Dielectric Voltage (kV/mm) | Conditions After 1000 Times of H/C (−45~125° C.) | Alignment During Processing |
| Example 1-1 | epoxy resin composition (A) | 10 | Cu | 0.3 | 0.88 | — | 29 | no abnormality | 002 plane |
| Example 1-1a | epoxy resin composition (A) | 5 | Cu | 0.3 | 0.88 | — | 29 | no abnormality | 002 plane |
| Example 1-1b | epoxy resin composition (B) | 20 | Cu | 0.3 | 0.88 | — | 29 | no abnormality | 002 plane |
| Example 1-1c | epoxy resin composition (C) | 50 | Cu | 0.3 | 0.88 | — | 29 | no abnormality | 002 plane |
| Example 1-1d | epoxy resin composition (D) | 100 | Cu | 0.3 | 0.88 | — | 29 | no abnormality | 002 plane |
| Example 1-2 | epoxy resin composition (A) | 50 | Cu | 0.05 | 0.88 | Ni: 4.0 | 29 | no abnormality | 002 plane |
| Example 1-3 | epoxy resin composition (A) | 50 | Cu | 1.5 | 0.88 | Ni: 4.0 | 29 | no abnormality | 002 plane |
| Example 1-4 | epoxy resin composition (A) | 50 | Al | 0.3 | 0.88 | Ni: 4.0 | 29 | no abnormality | 002 plane |
| Example 1-5 | epoxy resin composition (A) | 50 | Cu | 0.3 | 0.88 | Ni: 4.0 | 29 | no abnormality | 002 plane |
| Example 1-6 | epoxy resin composition (A) | 50 | Cu | 0.3 | 0.88 | Ni: 4.0 | 29 | no abnormality | 002 plane |
| Example 1-7 | epoxy resin composition (A) | 50 | Cu | 0.3 | 2.00 | Ni: 4.0 | 25 | no abnormality | 002 plane |
| Example 1-8 | epoxy resin composition (A) | 50 | Cu | 0.3 | 0.94 | Ni: 4.0 | 28 | no abnormality | 002 plane |

TABLE 1-3-continued

| | | Boron Nitride/Resin Composite Circuit Board | | | | | | |
|---|---|---|---|---|---|---|---|---|
| | Adhesion Layer | Thickness of Adhesion Layer (μm) | Metal Circuit | Thickness of Metal Circuit (mm) | CTE1/ CTE2 | Plating (μm) | Dielectric Voltage (kV/mm) | Conditions After 1000 Times of H/C (−45~125° C.) | Alignment During Processing |
|---|---|---|---|---|---|---|---|---|---|
| Example 1-9 | epoxy resin composition (A) | 50 | Cu | 0.3 | 0.50 | Ni: 4.0 | 30 | no abnormality | 002 plane |
| Example 1-10 | epoxy resin composition (A) | 50 | Cu | 0.3 | 0.94 | Ni: 4.0 | 25 | no abnormality | 002 plane |
| Comparative Example 1-1 | epoxy resin composition (A) | 50 | Cu | 0.3 | 4.71 | Ni: 4.0 | 24 | delamination of metal circuit | 100 plane |
| Comparative Example 1-2 | epoxy resin composition (A) | 50 | Cu | 0.3 | 2.06 | Ni: 4.0 | 23 | delamination of metal circuit | 002 plane |
| Comparative Example 1-3 | epoxy resin composition (A) | 50 | Cu | 0.3 | 2.65 | Ni: 4.0 | 22 | delamination of metal circuit | 002 plane |
| Comparative Example 1-4 | epoxy resin composition (A) | 50 | Cu | 2.0 | 2.06 | Ni: 4.0 | 22 | delamination of metal circuit | 002 plane |

As obvious from the comparison between the Examples and the Comparative Examples, the boron nitride/resin composite circuit board of the present invention is superior in heat dissipation characteristics and dielectric voltage characteristics, and is also superior in heat resistant cycle characteristics.

<Preparation of Boron Nitride Sintered Body 2>

Amorphous boron nitride powder, hexagonal boron nitride powder, and calcium carbonate ("PC-700" available from Shiraishi Kogyo Kaisha, Ltd.) were mixed using a Henschel mixer, followed by addition of water. Subsequently, the mixture was crushed using a ball mill for 5 hours to give an aqueous slurry. Then, to the aqueous slurry, polyvinyl alcohol resin ("Gohsenol" available from The Nippon Synthetic Chemical Industry Co., Ltd.) was added by 0.5 mass %, followed by agitation with heating at 50° C. until dissolved. Subsequently, spheroidizing treatment was carried out at a drying temperature of 230° C. using a spray dryer. Here, as the spheroidizing apparatus of the spray dryer, rotary atomizer was used. The resulting material thus obtained was filled into a boron nitride container, followed by atmospheric pressure sintering using a batch-type high-frequency furnace with a nitrogen flow of 5 L/min. Then, the sintered body was taken out from the boron nitride container to obtain the boron nitride sintered body. Subsequently, CIP was used to pressurize the boron nitride sintered body under prescribed conditions to conduct densification. As shown in Table 1-4, average grain size of boron nitride powder, formulation ratio, spray drying conditions, calcination conditions, and CIP pressurizing conditions were adjusted to prepare 3 kinds of boron nitride sintered body.

Impregnation of Epoxy Resin

Examples 1-11 to 1-13

Resin impregnation was conducted with the boron nitride sintered body thus obtained. The boron nitride sintered body and a mixture of epoxy resin ("Epikote 807" available from Mitsubishi Chemical Corporation) and curing agent ("Akumex H-84B" available from Nihon Gosei Kako Co., Ltd.) were degassed under vacuum of 70 Pa for 20 minutes, and then the epoxy resin mixture was poured into the boron nitride sintered body under vacuum, followed by 30 minutes of impregnation. Then, nitrogen gas was used to pressurize with a pressure of 3 MPa at 120° C. for 30 minutes, thereby impregnating and curing the resin to obtain the boron nitride-resin composite body.

Impregnation of Silicone Resin

Example 1-14

Boron nitride sintered body and silicone resin ("YE5822" available from Momentive Performance Materials Inc.) were degassed under vacuum of 70 Pa for 20 minutes, and then the silicone resin was poured into the boron nitride sintered body under vacuum, followed by 30 minutes of impregnation. Then, nitrogen gas was used to pressurize with a pressure of 3 MPa at 20° C. for 30 minutes, thereby impregnating the resin. Subsequently, the material was heated using a drying apparatus at 150° C. for 60 minutes to obtain the boron nitride-resin composite body.

TABLE 1-4

| | Average Grain Size of Boron Nitride Powder (μm) | | Formulation Ratio (mass %) | | | | Spray Drying Conditions Rotation | | |
|---|---|---|---|---|---|---|---|---|---|
| Conditions | Amorphous Boron Nitride | Hexagonal Boron Nitride | Amorphous Boron Nitride | Hexagonal Boron Nitride | Calcium Carbonate | Water | Number of Atomizer (rpm) | Calcination Temperature (° C.) | CIP Pressure (MPa) |
| 1I | 3.4 | 10.1 | 17.50 | 7.50 | 0.47 | 74.53 | 9000 | 2000 | 10 |
| 1J | 1.5 | 6.5 | 17.50 | 7.50 | 0.47 | 74.53 | 9000 | 2000 | 10 |
| 1K | 3.4 | 10.1 | 17.50 | 7.50 | 0.47 | 74.53 | 9000 | 2000 | 100 |

The resin-impregnated boron nitride sintered body thus obtained was subjected to processing using a multi wire saw. Here, the resin-impregnated boron nitride sintered body was cut out so that the 002 plane (c-axis) of the boron nitride particle is oriented with respect to the thickness direction. The evaluation results of the boron nitride sintered body are shown in Table 1-5.

ing onto the surface of the metal circuit. Subsequently, circuit was formed by etching using an etching solution containing copper chloride, followed by formation of an electroless Ni layer having a thickness of 4 μm onto the surface of the metal by plating treatment. Accordingly, the boron nitride/resin composite circuit board was prepared.

TABLE 1-5

Resin-impregnated Boron Nitride Sintered Body

| | Conditions | Resin | Boron Nitride (volume %) | Resin (volume %) | Average Long Diameter of Boron Nitride (μm) | I.O.P. | GI | Thermal Conductivity in Thickness Direction W/(m · K) | Thermal Conductivity in Plane Direction W/(m · K) | Bending Strength (MPa) | Linear Thermal Expansion Coefficient in Plane Direction (CTE1) (ppm/K) | Plate Thickness (mm) |
|---|---|---|---|---|---|---|---|---|---|---|---|---|
| Example 1-11 | 1I | epoxy | 55 | 45 | 17 | 1.1 | 1.6 | 34 | 38 | 12 | 32 | 0.32 |
| Example 1-12 | 1J | epoxy | 55 | 45 | 11 | 1.0 | 1.6 | 24 | 25 | 17 | 32 | 0.32 |
| Example 1-13 | 1K | epoxy | 70 | 30 | 16 | 1.0 | 1.6 | 48 | 50 | 35 | 26 | 0.32 |
| Example 1-14 | 1I | silicone | 55 | 45 | 17 | 1.1 | 1.6 | 31 | 33 | 10 | 32 | 0.32 |

<Circuit Formation, Plating>

To the plate-shaped resin-impregnated boron nitride sintered body thus obtained, an epoxy-resin composition (A) obtained by mixing 100 parts by mass of epoxy resin ("ep828" available from Mitsubishi Chemical Corporation), 60 parts by mass of curing agent ("VH-4150" available from DIC Corporation), 3 parts by mass of curing accelerator ("TPP" available from HOKKO CHEMICAL INDUSTRY CO., LTD.), and 500 parts by mass of alumina ("AKP-20" available from Sumitomo Chemical Company, Limited) as the inorganic filler using a planetary mixer for 15 minutes was coated onto both principal planes of the plate-shaped resin-impregnated boron nitride sintered body with a thickness of 10 μm. Then, hot press adhesion was performed with a copper plate having a thickness of 0.3 mm with a surface pressure of 1 MPa at 180° C. for 3 hours, thereby obtaining a composite body having the metal circuit adhered onto both principal planes. The composite body having metal circuit adhered thereon is further subjected to circuit pattern print- <Evaluation of Dielectric Voltage and Heat Resistant Cycle Characteristics>

With the boron nitride/resin composite circuit board obtained, dielectric voltage at alternating current was measured using a withstand voltage tester. Then, the boron nitride/resin composite circuit board was subjected to heat resistant cycle test performed by repeating the cycle of −40° C. for 30 minutes and 125° C. for 30 minutes for 1000 times, followed by observation of appearance and the adhesion conditions of the metal circuit using an ultrasonic test equipment. The results of evaluation of the boron nitride/resin composite circuit board are shown in Table 1-6.

TABLE 1-6

Boron Nitride/Resin Composite Circuit Board

| | Adhesion Layer | Thickness of Adhesion Layer (μm) | Metal Circuit | Thickness of Metal Circuit (mm) | CTE1/CTE2 | Plating (μm) | Dielectric Voltage (kV/mm) | Conditions After 1000 Times of H/C (−45~125° C.) |
|---|---|---|---|---|---|---|---|---|
| Example 1-11 | epoxy resin composition (A) | 10 | Cu | 0.3 | 1.88 | Ni: 4.0 | 22 | no abnormality |
| Example 1-12 | epoxy resin composition (A) | 10 | Cu | 0.3 | 1.88 | Ni: 4.0 | 20 | no abnormality |
| Example 1-13 | epoxy resin composition (A) | 10 | Cu | 0.3 | 1.53 | Ni: 4.0 | 16 | no abnormality |
| Example 1-14 | epoxy resin composition (A) | 10 | Cu | 0.3 | 1.88 | Ni: 4.0 | 26 | no abnormality |

As obvious from the Examples, the boron nitride/resin composite circuit board of the present invention is superior in heat dissipation characteristics and dielectric voltage characteristics, and is also superior in heat resistant cycle characteristics.

Here, with the boron nitride sintered body and the boron nitride molded body of the present invention, average long diameter of the boron nitride particle, porosity, I.O.P., and graphitization index by powder X-ray diffractometry were measured, and the measurement results were the same.

In addition, with the boron nitride sintered body and the boron nitride molded body of the present invention, bending strength and thermal conductivity measured with respect to the height direction when the 100 plane (a-axis) of the boron nitride particles were aligned with respect to the height direction; and bending strength and thermal conductivity measured with respect to the height direction when the 002 plane (c-axis) of the boron nitride particles were aligned with respect to the height direction; were the same.

Second Viewpoint

Hereinafter, the second viewpoint of the present invention will be described further specifically referring to Examples and Comparative Examples.
<Preparation of Boron Nitride Sintered Body 1>

Amorphous boron nitride powder having an average grain size of 0.3 μm (oxygen content of 1.8% and boron nitride purity of 97.0%) and an average grain size of 6.0 μm (oxygen content of 1.5% and boron nitride purity of 97.6%), hexagonal boron nitride powder having an average grain size of 2.0 μm (oxygen content of 0.2% and boron nitride purity of 98.6%), an average grain size of 18.0 μm (oxygen content of 0.3% and boron nitride purity of 99.0%), and an average grain size of 30.0 μm (oxygen content of 0.2% and boron nitride purity of 99.2%), and calcium carbonate ("PC-700" available from Shiraishi Kogyo Kaisha, Ltd.) were mixed using a conventional technique to give a mixed powder. Subsequently, the mixed powder for molding was used to conduct press molding at 0 to 20 MPa to give a block molded body. The block molded body thus obtained was subjected to a treatment by cold isotropic pressing method (CIP) in the range of 5 to 130 MPa, with a cycle number of 1 to 10 times. Then, sinteration was carried out in a batch-type high-frequency furnace with a nitrogen flow of 10 L/min, sinteration temperature of 1500 to 2150° C., and a holding time of 10 hours. Accordingly, 14 kinds of boron nitride sintered bodies (2A to 2N) were obtained.

Vacuum Impregnation of Epoxy Resin

Examples 2-1, 2-3 to 2-15 and Comparative Examples 2-1 to 2-9

The resin was impregnated into the boron nitride sintered bodies 2A to 2N thus obtained. The boron nitride sintered body and a mixture of an epoxy resin and curing agent ("bond E205" available from Konishi Co., Ltd) were degassed under vacuum of 1 mmHg for 10 minutes, and the mixture was then poured into the boron nitride sintered body under vacuum, followed by impregnation for 20 minutes. Subsequently, the resin was cured by heating at 150° C. for 60 minutes, thereby obtaining the resin-impregnated boron nitride sintered body having a thickness of 100 mm.

Vacuum Impregnation of Cyanate Resin

Example 2-2

The resin was impregnated into the boron nitride sintered body 2A thus obtained. The boron nitride sintered body, cyanate resin ("Bis-A based cyanate" available from MITSUBISHI GAS CHEMICAL COMPANY, INC.), and zinc octylate as the curing accelerator were degassed under vacuum of 1 mmHg for 10 minutes, and the resin and the curing accelerator was then poured into the boron nitride sintered body under vacuum, followed by impregnation for 20 minutes. Subsequently, the resin was cured by heating at 150° C. for 60 minutes, thereby obtaining the resin-impregnated boron nitride sintered body having a thickness of 100 mm.

Preparation of Plate-shaped Resin-impregnated Boron Nitride Sintered Body, Circuit Formation, Plating Examples 2-1 to 2-2, 2-4 to 2-15, and Comparative Examples 2-1 to 2-9

The resin-impregnated boron nitride sintered body thus obtained was processed into a plate shape having various thickness as shown in Examples of Table 2-2 and 2-3 and in Comparative Examples of Table 2-4, using a multi wire saw

TABLE 2-1

| Plate-shaped Resin-impregnated Boron Nitride Sintered Body | Average Grain Size of Boron Nitride Powder (μm) | | Formulation of Boron Nitride Powder (mass %) | | Calcination Temperature (° C.) | CIP | | |
|---|---|---|---|---|---|---|---|---|
| | Amorphous BN | Hexagonal BN | Amorphous BN | Hexagonal BN | | Molding Pressure (MPa) | Pressure (MPa) | Number of Cycles |
| 2A | 6.0 | 18.0 | 40 | 60 | 2050 | 5 | 100 | 1 |
| 2B | 0.3 | 2.0 | 40 | 60 | 1950 | 5 | 10 | 1 |
| 2C | 6.0 | 30.0 | 40 | 60 | 2150 | 5 | 100 | 1 |
| 2D | 6.0 | 18.0 | 40 | 60 | 2050 | 5 | 10 | 1 |
| 2E | 6.0 | 18.0 | 40 | 60 | 2050 | 5 | 130 | 1 |
| 2F | 6.0 | 18.0 | 40 | 60 | 2050 | 1 | 100 | 1 |
| 2G | 6.0 | 18.0 | 40 | 60 | 2050 | 10 | 100 | 1 |
| 2H | 6.0 | 18.0 | 80 | 20 | 1700 | 5 | 100 | 1 |
| 2I | 0.3 | 2.0 | 60 | 40 | 1950 | 5 | 10 | 1 |
| 2J | 6.0 | 30.0 | 10 | 90 | 2150 | 5 | 100 | 1 |
| 2K | 6.0 | 18.0 | 40 | 60 | 2050 | 5 | 5 | 1 |
| 2L | 6.0 | 18.0 | 40 | 60 | 2050 | 5 | 130 | 10 |
| 2M | 6.0 | 18.0 | 40 | 60 | 2050 | 0 (none) | 100 | 1 |
| 2N | 6.0 | 18.0 | 40 | 60 | 2050 | 20 | 100 | 1 | or a machining center. To the plate-shaped resin-impregnated boron nitride sintered body thus obtained, composition (A) obtained by mixing 100 parts by mass of epoxy resin ("EP828" available from Mitsubishi Chemical Corporation), 60 parts by mass of curing agent ("VH-4150" available from DIC Corporation), 3 parts by mass of curing accelerator ("TPP" available from HOKKO CHEMICAL INDUSTRY CO., LTD.), and 500 parts by mass of inorganic filler ("AKP-15" available from Sumitomo Chemical Company, Limited) using a planetary mixer for 15 minutes was coated onto both principal planes of the plate-shaped resin-impregnated boron nitride sintered body with a thickness of 10 μm as the adhesion layer. Then, hot press adhesion was performed with the copper of the metal circuit with a surface pressure of 1 MPa at 180° C. for 3 hours, thereby obtaining a composite body having the metal circuit adhered on both principal planes. The composite body having metal circuit adhered thereon was further subjected to circuit pattern printing onto the surface of the metal circuit. Subsequently, circuit was formed by etching using an etching solution containing copper chloride, followed by formation of a nickel plating layer onto the surface of the metal circuit by plating treatment. Accordingly, the boron nitride/resin composite circuit board was prepared.

Preparation of Plate-shaped Resin-impregnated Boron Nitride Sintered Body, Circuit Formation, Plating Example 2-3

Boron nitride/resin composite circuit board was prepared in a similar manner as Example 2-1, except that "silver filler for conductive paste EA-0001" (available from Metalor) was used as the inorganic filler for the plate-shaped resin-impregnated boron nitride sintered body obtained.

<Evaluation of Heat Dissipation Characteristics>

A test piece of the boron nitride/resin composite circuit board before etching as the measuring sample was cut into 10×10 mm. Measurement was performed in accordance with ASTM D5470, thereby obtaining thermal resistance value of the test piece ($A=\Delta T/Q$; ° C./W) from the difference in temperature $\Delta T$ (° C.) between both sides of the test piece and electricity consumption $Q(W)$ of the heat source. The evaluation results of the boron nitride/resin composite circuit board thus obtained are shown in Tables 2-2 to 2-4.

<Evaluation of Heat Resistant Cycle Characteristics>

The insulation breakdown voltage of the boron nitride/resin composite circuit board after etching was measured in accordance with JIS C 2141. Then, the boron nitride/resin composite circuit board was subjected to heat resistant cycle test performed by repeating the cycle of −40° C. for 30 minutes and 125° C. for 30 minutes for 1000 times, followed by observation of appearance and the adhesion conditions of the metal circuit using an ultrasonic test equipment. Further, insulation breakdown voltage was measured, and the falling ratio of the insulation breakdown voltage after 1000 heat cycles was calculated with the following equation.

falling ratio of the insulation breakdown voltage after 1000 heat cycles (%)=((initial insulation breakdown voltage−insulation breakdown voltage after 1000 heat cycles)÷initial insulation breakdown voltage)×100

The results of evaluation of the boron nitride/resin composite circuit board are shown in Tables 2-2 to 2-4.

<Evaluation of Impact Strength Characteristics>

The boron nitride/resin composite circuit board after etching was allowed to drop for 100 times from a height of 1 m in accordance with JIS C 60028-2-31, paragraph 5.3 "gravity fall test—repeated (method 2)". Subsequently, insulation breakdown voltage was measured, and the falling ratio of the insulation breakdown voltage after gravity fall test (100 times) was calculated with the following equation. The evaluation results are shown in Tables 2-2 to 2-4.

falling ratio of the insulation breakdown voltage after gravity fall test (100 times) (%)=((initial insulation breakdown voltage−insulation breakdown voltage after gravity fall test (100 times))÷initial insulation breakdown voltage)×100

TABLE 2-2

| Item | Example 2-1 | 2-2 | 2-3 | 2-4 | 2-5 | 2-6 | 2-7 |
|---|---|---|---|---|---|---|---|
| Plate-shaped Resin-impregnated Boron Nitride Sintered Body | 2A | 2A | 2A | 2B | 2C | 2D | 2E |
| Resin | epoxy | cyanate | epoxy | epoxy | epoxy | epoxy | epoxy |
| Adhesion Layer | composition (A) | composition (A) | composition (B) | composition (A) | composition (A) | composition (A) | composition (A) |
| Average Long Diameter of Boron Nitride Particles (μm) | 20 | 20 | 20 | 7 | 44 | 20 | 20 |
| Ratio of Boron Nitride Sintered Body (volume %) | 67 | 67 | 67 | 67 | 67 | 33 | 80 |
| Ratio of Resin (volume %) | 33 | 33 | 33 | 33 | 33 | 67 | 20 |
| Plate Thickness of Plate-shaped Resin-impregnated Boron Nitride Sintered Body (mm) | 0.32 | 0.32 | 0.32 | 0.32 | 0.32 | 0.32 | 0.32 |
| Ratio of projected area of profile when observed from the thickness direction of metal circuit A and projected area of profile when observed from the thickness direction of plate-shaped resin-impregnated boron nitride sintered body (A/B) | 1.1 | 1.1 | 1.1 | 1.1 | 1.1 | 1.1 | 1.1 |
| Ratio of linear thermal expansion coefficient in plane direction of resin-impregnated boron nitride sintered body at 40 to 150° C. (CTE1) and linear thermal expansion coefficient of metal circuit at 40 to 150° C. (CTE1/CTE2) | 0.88 | 0.88 | 0.88 | 0.87 | 0.90 | 0.88 | 0.85 |

TABLE 2-2-continued

| Item | Example 2-1 | 2-2 | 2-3 | 2-4 | 2-5 | 2-6 | 2-7 |
|---|---|---|---|---|---|---|---|
| GI | 1.1 | 1.1 | 1.1 | 1.2 | 0.9 | 1.1 | 1.1 |
| Plate Thickness of Metal Circuit (mm) | 0.3 | 0.3 | 0.3 | 0.3 | 0.3 | 0.3 | 0.3 |
| Strength of Plate-shaped Resin-impregnated Boron Nitride Sintered Body (MPa) | 25.0 | 27.2 | 25.0 | 38.0 | 22.0 | 45.0 | 21.0 |
| Thermal Conductivity of Plate-shaped Resin-impregnated Boron Nitride Sintered Body in Plate Thickness Direction W/(m · K) | 36.0 | 37.2 | 36.0 | 35.1 | 37.5 | 30.0 | 40.2 |
| Heat Resistance of Boron Nitride/Resin Composite Circuit Board (° C./W) | 0.17 | 0.17 | 0.17 | 0.17 | 0.17 | 0.19 | 0.16 |
| Adhesion Condition of Metal Circuit After 1000 Times of Heat Cycles | no abnormality | no abnormality | no abnormality | no abnormality | no abnormality | no abnormality | no abnormality |
| Initial Insulation Breakdown Voltage (kV/mm) | 32.5 | 33.2 | 32.5 | 34.1 | 31.8 | 36.2 | 32.0 |
| Insulation Breakdown Voltage After 1000 Times of Heat Cycles (kV/mm) | 32.3 | 33.1 | 32.3 | 34.0 | 31.8 | 36.0 | 31.5 |
| Falling Ratio of Insulation Breakdown Voltage After 1000 Times of Heat Cycles (%) | 0.6 | 0.3 | 0.6 | 0.3 | 0.0 | 0.6 | 1.6 |
| Insulation Breakdown Voltage After Gravity Fall Test (100 Times) (kV/mm) | 32.5 | 32.8 | 32.5 | 33.8 | 31.0 | 35.8 | 31.7 |
| Falling Ratio of Insulation Breakdown Voltage After Gravity Fall Test (100 Times) (%) | 0.0 | 1.2 | 0.0 | 1.5 | 2.5 | 1.1 | 0.9 |

TABLE 2-3

| Item | Example 2-8 | 2-9 | 2-10 | 2-11 | 2-12 | 2-13 | 2-14 | 2-15 |
|---|---|---|---|---|---|---|---|---|
| Plate-shaped Resin-impregnated Boron Nitride Sintered Body | 2A | 2A | 2A | 2F | 2G | 2H | 2A | 2A |
| Resin | epoxy | epoxy | epoxy | epoxy | epoxy | epoxy | epoxy | epoxy |
| Adhesion Layer | composition (A) | composition (A) | composition (A) | composition (A) | composition (A) | composition (A) | composition (A) | composition (A) |
| Average Long Diameter of Boron Nitride Particles (μm) | 20 | 20 | 20 | 20 | 20 | 20 | 20 | 20 |
| Ratio of Boron Nitride Sintered Body (volume %) | 67 | 67 | 67 | 67 | 67 | 67 | 67 | 67 |
| Ratio of Resin (volume %) | 33 | 33 | 33 | 33 | 33 | 33 | 33 | 33 |
| Plate Thickness of Plate-shaped Resin-impregnated Boron Nitride Sintered Body (mm) | 0.22 | 1.41 | 0.32 | 0.32 | 0.32 | 0.32 | 0.32 | 0.32 |
| Ratio of projected area of profile when observed from the thickness direction of metal circuit A and projected area of profile when observed from the thickness direction of plate-shaped resin-impregnated boron nitride sintered body (A/B) | 1.1 | 1.1 | 1.0 | 1.1 | 1.1 | 1.1 | 1.1 | 1.1 |
| Ratio of linear thermal expansion coefficient in plane direction of resin-impregnated boron nitride sintered body at 40 to 150° C. (CTE1) and linear thermal expansion coefficient of metal circuit at 40 to 150° C. (CTE1/CTE2) | 0.86 | 0.85 | 0.88 | 0.52 | 1.90 | 0.91 | 0.89 | 0.88 |
| GI | 1.1 | 1.1 | 1.1 | 1.1 | 1.1 | 3.7 | 1.1 | 1.1 |
| Plate Thickness of Metal Circuit (mm) | 0.3 | 0.3 | 0.3 | 0.3 | 0.3 | 0.3 | 0.07 | 1.4 |
| Strength of Plate-shaped Resin-impregnated Boron Nitride Sintered Body (MPa) | 15.0 | 51.0 | 24.8 | 25.2 | 27.2 | 28.3 | 24.3 | 28.2 |
| Thermal Conductivity of Plate-shaped Resin-impregnated Boron Nitride Sintered Body in Plate Thickness Direction W/(m · K) | 34.2 | 35.9 | 36.9 | 35.3 | 36.8 | 32.1 | 34.2 | 35.5 |
| Heat Resistance of Boron Nitride/Resin Composite Circuit Board (° C./W) | 0.14 | 0.32 | 0.17 | 0.17 | 0.17 | 0.18 | 0.17 | 0.17 |
| Adhesion Condition of Metal Circuit After 1000 Times of Heat Cycles | no abnormality | no abnormality | no abnormality | no abnormality | no abnormality | no abnormality | no abnormality | no abnormality |
| Initial Insulation Breakdown Voltage (kV/mm) | 32.5 | 33.0 | 33.2 | 33.5 | 32.1 | 31.9 | 31.6 | 32.2 |
| Insulation Breakdown Voltage After 1000 Times of Heat Cycles (kV/mm) | 32.1 | 32.8 | 33.2 | 33.4 | 32.0 | 31.9 | 31.6 | 31.8 |
| Falling Ratio of Insulation Breakdown Voltage After 1000 Times of Heat Cycles (%) | 1.2 | 0.6 | 0.0 | 0.3 | 0.3 | 0.0 | 0.0 | 1.2 |
| Insulation Breakdown Voltage After Gravity Fall Test (100 Times) (kV/mm) | 32.0 | 32.8 | 33.2 | 33.0 | 32.0 | 31.7 | 31.0 | 32.0 |
| Falling Ratio of Insulation Breakdown Voltage After Gravity Fall Test (100 Times) (%) | 1.5 | 0.6 | 0.0 | 1.5 | 0.3 | 0.6 | 1.9 | 0.6 |

TABLE 2-4

| Item | Comparative Example | | | | | | | | |
|---|---|---|---|---|---|---|---|---|---|
| | 2-1 | 2-2 | 2-3 | 2-4 | 2-5 | 2-6 | 2-7 | 2-8 | 2-9 |
| Plate-shaped Resin-impregnated Boron Nitride Sintered Body | 2I | 2J | 2K | 2L | 2A | 2A | 2A | 2M | 2N |
| Resin | epoxy | epoxy | epoxy | epoxy | epoxy | epoxy | epoxy | epoxy | epoxy |
| Adhesion Layer | Composition (A) | Composition (A) | Composition (A) | Composition (A) | Composition (A) | Composition (A) | Composition (A) | Composition (A) | Composition (A) |
| Average Long Diameter of Boron Nitride Particles (μm) | 4 | 58 | 20 | 20 | 20 | 20 | 20 | 20 | 13 |
| Ratio of Boron Nitride Sintered Body (volume %) | 67 | 67 | 26 | 91 | 87 | 67 | 67 | 67 | 67 |
| Ratio of Resin (volume %) | 33 | 33 | 74 | 9 | 33 | 33 | 33 | 33 | 33 |
| Plate Thickness of Plate-shaped Resin-impregnated Boron Nitride Sintered Body (mm) | 0.32 | 0.32 | 0.32 | 0.32 | 0.17 | 2.00 | 0.32 | 0.32 | 0.32 |
| Ratio of projected area of profile when observed from the thickness direction of metal circuit A and projected area of profile when observed from the thickness direction of plate-shaped resin-impregnated boron nitride sintered body (A/B) | 1.1 | 1.1 | 1.1 | 1.1 | 1.1 | 1.1 | 0.8 | 1.1 | 1.1 |
| Ratio of linear thermal expansion coefficient in plane direction of resin-impregnated boron nitride sintered body at 40 to 150° C. (CTE1) and linear thermal expansion coefficient of metal circuit at 40 to 150° C. (CTE1/CTE2) | 0.87 | 0.90 | 0.88 | 0.85 | 0.86 | 0.85 | 0.88 | 0.40 | 2.30 |
| GI | 1.2 | 0.9 | 1.1 | 1.1 | 1.1 | 1.1 | 1.1 | 1.1 | 1.9 |
| Plate Thickness of Metal Circuit (mm) | 0.3 | 0.3 | 0.3 | 0.3 | 0.3 | 0.3 | 0.3 | 0.3 | 0.3 |
| Strength of Plate-shaped Resin-impregnated Boron Nitride Sintered Body (MPa) | 44.8 | 8.0 | 31.8 | 7.5 | 6.2 | 52.1 | 25.0 | 24.8 | 24.3 |
| Thermal Conductivity of Plate-shaped Resin-impregnated Boron Nitride Sintered Body in Plate Thickness Direction W/(m · K) | 7.3 | 35.1 | 5.2 | 38.0 | 31.5 | 32.8 | 36.0 | 35.2 | 35.5 |
| Heat Resistance of Boron Nitride/Resin Composite Circuit Board (° C./W) | 0.59 | 0.17 | 0.70 | 0.16 | 0.13 | 0.69 | 0.17 | 0.17 | 0.17 |
| Adhesion Condition of Metal Circuit After 1000 Times of Heat Cycles | no abnormality | no abnormality | no abnormality | no abnormality | no abnormality | no abnormality | no abnormality | delamination | delamination |
| Initial Insulation Breakdown Voltage (kV/mm) | 15.0 | 31.8 | 37.0 | 31.5 | 12.0 | 38.2 | 33.0 | 30.5 | 31.5 |
| Insulation Breakdown Voltage After 1000 Times of Heat Cycles (kV/mm) | 10.0 | 24.5 | 35.8 | 23.5 | 2.0 | 18.0 | 29.5 | 8.7 | 10.0 |
| Falling Ratio of Insulation Breakdown Voltage After 1000 Times of Heat Cycles (%) | 33.3 | 23.0 | 3.2 | 25.4 | 83.3 | 52.9 | 10.6 | 71.5 | 38.3 |
| Insulation Breakdown Voltage After Gravity Fall Test (100 Times) (kV/mm) | 8.0 | 22.5 | 35.5 | 20.5 | 3.5 | 38.0 | 1.0 | 29.0 | 30.8 |
| Falling Ratio of Insulation Breakdown Voltage After Gravity Fall Test (100 Times) (%) | 46.7 | 29.2 | 4.1 | 34.9 | 70.8 | 0.5 | 97.0 | 0.0 | 2.2 |

As obvious from the comparison between the Examples and the Comparative Examples, the boron nitride/resin composite circuit board of the present invention is superior in heat dissipation characteristics, heat resistant cycle characteristics, and impact strength characteristics.

Third Viewpoint

Hereinafter, the third viewpoint of the present invention will be described further specifically referring to Examples and Comparative Examples.

<Preparation of Boron Nitride Sintered Body 1>

Amorphous boron nitride powder having an average grain size of 0.3 μm (oxygen content of 1.8% and boron nitride purity of 97.0%) and an average grain size of 6.0 μm (oxygen content of 1.5% and boron nitride purity of 97.6%), hexagonal boron nitride powder having an average grain size of 2.0 μm (oxygen content of 0.2% and boron nitride purity of 98.6%), an average grain size of 18.0 μm (oxygen content of 0.3% and boron nitride purity of 99.0%), and an average grain size of 30.0 μm (oxygen content of 0.2% and boron nitride purity of 99.2%), and calcium carbonate ("PC-700" available from Shiraishi Kogyo Kaisha, Ltd.) were mixed using a conventional technique such as a Henschel mixer (available from NIPPON COKE & ENGINEERING Co., LTD.) to give a mixed powder. Subsequently, the mixed powder for molding was used to conduct press molding at 0 to 20 MPa to give a compressed block molded body. The block molded body thus obtained was subjected to a treatment by cold isotropic pressing method (CIP) in the range of 5 to 130 MPa, with a cycle number of 1 to 10 times. Then, sinteration was carried out in a batch-type high-frequency furnace with a nitrogen flow of 10 L/min, sinteration temperature of 1500 to 2150° C., and a holding time of 10 hours. Accordingly, boron nitride sintered body was obtained.

<Vacuum Impregnation of Epoxy Resin, Test Nos. 3-1-1, 3-1-3 to 3-1-12>

The resin was impregnated into the boron nitride sintered bodies A and B to L thus obtained. The boron nitride sintered body and a mixture of an epoxy resin and curing agent ("bond E205" available from Konishi Co., Ltd) were degassed under vacuum of 1 mmHg for 10 minutes, and the mixture was then poured into the boron nitride sintered body under vacuum, followed by impregnation for 20 minutes. Subsequently, the resin was cured by heating at 150° C. for 60 minutes, thereby obtaining 12 kinds of resin-impregnated boron nitride sintered body having a thickness of 100 mm as shown in Table 3-1.

<Vacuum Impregnation of Cyanate Resin, Test No. 3-1-2>

The resin was impregnated into the boron nitride sintered body B thus obtained. The boron nitride sintered body, cyanate resin ("Bis-A-based cyanate" available from MITSUBISHI GAS CHEMICAL COMPANY, INC.), and zinc octylate as the curing accelerator were degassed under vacuum of 1 mmHg for 10 minutes, and the resin and the curing accelerator were then poured into the boron nitride sintered body under vacuum, followed by impregnation for 20 minutes. Subsequently, the resin was cured by heating at 150° C. for 60 minutes, thereby obtaining the resin-impregnated boron nitride sintered body having a thickness of 100 mm.

mixing 100 parts by mass of epoxy resin ("jer807" available from Mitsubishi Chemical Corporation), 83 parts by mass of curing agent ("MEH8005" available from Showa Kasei Kogyo Co., Ltd.), and 3 parts by mass of curing accelerator ("TPP" available from HOKKO CHEMICAL INDUSTRY CO., LTD.) using a planetary mixer for 15 minutes was coated with a thickness of 10 μm as the adhesion layer. Then, hot press adhesion was performed with the metal circuit and the metal heat dissipation plate each made of copper or aluminum with a surface pressure of 1 MPa at 180° C. for 3 hours, thereby obtaining a composite body having the metal circuit adhered. The composite body having metal circuit adhered thereon was further subjected to circuit pattern printing onto the surface of the metal circuit. Subsequently, circuit was formed by etching using an etching solution containing copper chloride or sodium hydroxide or sulfuric acid-hydrogen peroxide solution, followed by formation of a nickel plating layer onto the surface of the metal circuit by plating treatment. Accordingly, the boron nitride/resin composite circuit board was prepared.

<Evaluation of Heat Dissipation Characteristics>

A test piece of the boron nitride/resin composite circuit board before etching as the measuring sample was cut into 10×10×0.32 mm. Measurement was performed in accordance with ASTM D5470, thereby obtaining difference in temperature ΔT (° C.) between both sides of the test piece,

TABLE 3-1

Resin-impregnated Boron Nitride Sintered Body

| Test No. | Type | Resin | Average Long Diameter (μm) | Ratio of Boron Nitride Sintered Body (volume %) | Ratio of Resin (volume %) | Sintering Temperature (° C.) | (Preforming) Molding Pressure (MPa) | CIP Pressure (MPa) | GI | Thermal Conductivity of Resin-impregnated Boron Nitride Sintered Body in Height Direction W/(m·K) | Type |
|---|---|---|---|---|---|---|---|---|---|---|---|
| 3-1-1 | 3A | epoxy | 20 | 67 | 33 | 2050 | 5 | 100 | 1.1 | 36.0 | Example |
| 3-1-2 | 3B | cyanate | 20 | 67 | 33 | 2050 | 5 | 100 | 1.1 | 37.2 | Example |
| 3-1-3 | 3C | epoxy | 7 | 67 | 33 | 2050 | 5 | 100 | 1.2 | 35.1 | Example |
| 3-1-4 | 3D | epoxy | 44 | 67 | 33 | 2050 | 5 | 100 | 0.9 | 37.5 | Example |
| 3-1-5 | 3E | epoxy | 20 | 33 | 67 | 2050 | 5 | 100 | 1.1 | 30.0 | Example |
| 3-1-6 | 3F | epoxy | 20 | 80 | 20 | 2050 | 5 | 100 | 1.1 | 40.2 | Example |
| 3-1-7 | 3G | epoxy | 20 | 67 | 33 | 2050 | 0 | 0 | not measureable | not measureable | Example |
| 3-1-8 | 3H | epoxy | 20 | 67 | 33 | 1900 | 5 | 100 | 1.2 | 30.0 | Example |
| 3-1-9 | 3I | epoxy | 4 | 67 | 33 | 2050 | 5 | 100 | 1.2 | 7.3 | Comparative Example |
| 3-1-10 | 3J | epoxy | 58 | 67 | 33 | 2050 | 5 | 100 | 0.9 | 35.1 | Comparative Example |
| 3-1-11 | 3K | epoxy | 20 | 26 | 74 | 2050 | 5 | 100 | 1.1 | 5.2 | Comparative Example |
| 3-1-12 | 3L | epoxy | 20 | 91 | 9 | 2050 | 5 | 100 | 1.1 | 38.0 | Comparative Example |

<Preparation of Plate-Shaped Resin-Impregnated Boron Nitride Sintered Body, Circuit Formation, Plating: Test Nos. 3-2-1 to 3-2-18>

The resin-impregnated boron nitride sintered body thus obtained was processed into a plate shape having a thickness of 0.32 mm, using a multi wire saw or a machining center. To the plate-shaped resin-impregnated boron nitride sintered body thus obtained and to aluminum nitride (available from TOSHIBA MATERIALS CO., LTD.) and silicon nitride (available from TOSHIBA MATERIALS CO., LTD.) used as the Comparative Example, composition (A) obtained by electricity consumption Q(W) of the heat source, and a thermal resistance value of the test piece (A=ΔT/Q; ° C./W). The evaluation results of the boron nitride/resin composite circuit board thus obtained are shown in Table 3-2.

<Evaluation of Heat Resistant Cycle Characteristics>

The insulation breakdown voltage of the boron nitride/resin composite circuit board after etching was measured in accordance with JIS C 2141. Then, the boron nitride/resin composite circuit board was subjected to heat resistant cycle test performed by repeating the cycle of −40° C. for 30 minutes and 125° C. for 30 minutes for 1000 times, followed by observation of appearance and the adhesion conditions of the metal circuit using an ultrasonic test equipment. The adhesion conditions were compared with the bonding ratio before and after the heat resistant cycle test using the ultrasonic test equipment. Here, the initial bonding area is an area to be bonded before bonding, that is, the area of the insulating layer. Since delamination is shown as a black portion in the bonding portion in the ultrasonic image, delamination was defined as a case where the area of the black portion becomes larger after the heat resistant cycle test. Further, insulation breakdown voltage was measured, and the falling ratio of the insulation breakdown voltage after 1000 heat cycles was calculated with the following equation.

falling ratio of the insulation breakdown voltage after 1000 heat cycles (%)=((initial insulation breakdown voltage−insulation breakdown voltage after 1000 heat cycles)÷initial insulation breakdown voltage)×100

The results of evaluation of the boron nitride/resin composite circuit board are shown in Table 3-3.

<Evaluation of Impact Strength Characteristics>

The boron nitride/resin composite circuit board after etching was allowed to drop for 100 times from a height of 1 m in accordance with JIS C 60028-2-31, paragraph 5.3 "gravity fall test—(method 2)". Subsequently, insulation breakdown voltage was measured, and the falling ratio of the insulation breakdown voltage after gravity fall test (100 times) was calculated with the following equation. The evaluation results are shown in Table 3-3.

falling ratio of the insulation breakdown voltage after gravity fall test (100 times) (%)=((initial insulation breakdown voltage−insulation breakdown voltage after gravity fall test (100 times))÷initial insulation breakdown voltage)×100

TABLE 3-2

| | Insulating Layer Type | Metal Circuit — | Thickness of Metal Circuit (mm) | Metal Heat Dissipation Plate — | Thickness of Metal Heat Dissipation Plate (mm) | Thermal Resistance of Circuit Board °C./W | Type |
|---|---|---|---|---|---|---|---|
| 3-2-1 | 3A | copper | 0.03 | copper | 3.0 | 0.18 | Example |
| 3-2-2 | 3A | copper | 0.30 | copper | 3.0 | 0.17 | Example |
| 3-2-3 | 3A | copper | 0.30 | copper | 6.5 | 0.18 | Example |
| 3-2-4 | 3B | copper | 0.30 | copper | 6.5 | 0.21 | Example |
| 3-2-5 | 3C | copper | 0.30 | copper | 6.5 | 0.17 | Example |
| 3-2-6 | 3D | copper | 0.30 | copper | 6.5 | 0.17 | Example |
| 3-2-7 | 3E | copper | 0.30 | copper | 6.5 | 0.19 | Example |
| 3-2-8 | 3F | copper | 0.30 | copper | 6.5 | 0.16 | Example |
| 3-2-9 | 3A | copper | 0.30 | aluminum | 6.5 | 0.17 | Example |
| 3-2-10 | 3A | aluminum | 0.30 | copper | 6.5 | 0.17 | Example |
| 3-2-11 | aluminum nitride | copper | 0.30 | copper | 6.5 | 0.10 | Comparative Example |
| 3-2-12 | silicon nitride | copper | 0.30 | copper | 6.5 | 0.17 | Comparative Example |
| 3-2-13 | 3A | copper | 0.01 | copper | 3.0 | 0.17 | Comparative Example |
| 3-2-14 | 3A | copper | 0.30 | copper | 1.0 | 0.17 | Comparative Example |
| 3-2-15 | 3A | copper | 0.30 | copper | 9.0 | 0.25 | Comparative Example |
| 3-2-17 | 3A | copper | 0.30 | aluminum | 9.0 | 0.29 | Comparative Example |
| 3-2-18 | 3A | aluminum | 0.30 | copper | 9.0 | 0.25 | Comparative Example |

TABLE 3-3

| | Adhesion Condition After 1000 Heat Cycles — | Initial Insulation Breakdown kV/(mm) | Insulation Breakdown Voltage After 1000 Heat Cycles kV/(mm) | Falling Ratio of Insulation Breakdown Voltage After 1000 Heat Cycles % | Insulation Breakdown Voltage After Gravity Fall Test (100 Times) kV/(mm) | Falling Ratio of Insulation Breakdown Voltage After Gravity Fall Test (100 Times) % | Type |
|---|---|---|---|---|---|---|---|
| 3-2-1 | no abnormality | 31.1 | 29.5 | 5.1 | 30.5 | 1.9 | Example |
| 3-2-2 | no abnormality | 31.2 | 30.8 | 1.3 | 30.8 | 1.3 | Example |
| 3-2-3 | no abnormality | 30.8 | 29.3 | 4.9 | 30.5 | 1.0 | Example |
| 3-2-4 | no abnormality | 31.1 | 29.5 | 5.1 | 30.5 | 1.9 | Example |
| 3-2-5 | no abnormality | 31.2 | 30.8 | 1.3 | 30.8 | 1.3 | Example |
| 3-2-6 | no abnormality | 30.8 | 29.3 | 4.9 | 30.5 | 1.0 | Example |
| 3-2-7 | no abnormality | 31.1 | 29.5 | 5.1 | 30.5 | 1.9 | Example |
| 3-2-8 | no abnormality | 31.2 | 30.8 | 1.3 | 30.8 | 1.3 | Example |
| 3-2-9 | no abnormality | 30.8 | 29.8 | 3.2 | 30.4 | 1.3 | Example |
| 3-2-10 | no abnormality | 35.2 | 34.6 | 1.7 | 34.8 | 1.1 | Example |

TABLE 3-3-continued

| | Adhesion Condition After 1000 Heat Cycles | Initial Insulation Breakdown kV/(mm) | Insulation Breakdown Voltage After 1000 Heat Cycles kV/(mm) | Falling Ratio of Insulation Breakdown Voltage After 1000 Heat Cycles % | Insulation Breakdown Voltage After Gravity Fall Test (100 Times) kV/(mm) | Falling Ratio of Insulation Breakdown Voltage After Gravity Fall Test (100 Times) % | Type |
|---|---|---|---|---|---|---|---|
| 3-2-11 | delamination | 15.8 | 1.0 | 93.7 | 15.6 | 1.3 | Comparative Example |
| 3-2-12 | delamination | 15.7 | 0.9 | 94.3 | 15.6 | 0.6 | Comparative Example |
| 3-2-13 | no abnormality | 31.1 | 9.2 | 70.4 | 5.2 | 83.3 | Comparative Example |
| 3-2-14 | no abnormality | 31.0 | 9.2 | 70.3 | 5.1 | 83.5 | Comparative Example |
| 3-2-15 | delamination | 30.5 | 7.8 | 74.4 | 29.5 | 3.3 | Comparative Example |
| 3-2-17 | delamination | 31.2 | 7.8 | 75.0 | 30.0 | 3.8 | Comparative Example |
| 3-2-18 | delamination | 35.8 | 8.9 | 75.1 | 34.5 | 3.6 | Comparative Example |

As obvious from the comparison between the Examples and the Comparative Examples, the boron nitride/resin composite circuit board of the present invention is superior in heat dissipation characteristics, heat resistant cycle characteristics, and impact strength characteristics.

INDUSTRIAL APPLICABILITY

The boron nitride/resin composite circuit board of the present invention is suitably used as a circuit board of a thermogenic electronic parts such as a power device, and is used especially in high output power modules for vehicles and the like which require high reliability.

EXPLANATION OF SYMBOLS 1 resin-impregnated boron nitride sintered body
2 boron nitride particle
3 resin
4 adhesion layer
5 metal circuit
6 metal heat dissipation plate
7 aluminum nitride or silicon nitride
8 adhesion layer or brazing material such as silver paste

The invention claimed is:

1. A boron nitride/resin composite circuit board, comprising:
   a plate-shaped resin-impregnated boron nitride sintered body having a plate thickness of 0.2 to 1.5 mm, the plate-shaped resin-impregnated boron nitride sintered body comprising 30 to 85 volume % of a boron nitride sintered body having boron nitride particles bonded three-dimensionally, the boron nitride particles having an average long diameter of 5 to 50 μm, and 70 to 15 volume % of a resin; and
   a metal circuit adhered onto both principal planes of the plate-shaped resin-impregnated boron nitride sintered body, the metal circuit being copper, aluminum, or alloys thereof; wherein:
      a ratio of a linear thermal expansion coefficient in a plane direction of the resin-impregnated boron nitride sintered body at 40 to 150° C. (CTE1) and a linear thermal expansion coefficient of the metal circuit at 40 to 150° C. (CTE2) (CTE1/CTE2) is 0.5 to 2.0.

2. The boron nitride/resin composite circuit board of claim 1, wherein a graphitization index (GI) of the resin-impregnated boron nitride sintered body by powder X-ray diffractometry is 4.0 or lower.

3. The boron nitride/resin composite circuit board of claim 1, wherein a strength of the boron nitride/resin composite circuit board is 10 to 70 MPa, and a thermal conductivity in a plate thickness direction is 10 to 110 W/(m·K).

4. The boron nitride/resin composite circuit board of claim 1, wherein the resin is a thermosetting resin.

5. The boron nitride/resin composite circuit board of claim 1, wherein a plate thickness of the metal circuit is 0.05 to 1.5 mm.

6. The boron nitride/resin composite circuit board of claim 1, wherein an adhesion layer provided between the resin-impregnated boron nitride sintered body and the metal circuit is an epoxy-resin composition comprising an epoxy resin and an inorganic filler.

7. The boron nitride/resin composite circuit board according to claim 1, wherein with respect to the metal circuit provided on at least one principal plane of the plate-shaped resin-impregnated boron nitride sintered body, a ratio of a projected area A/a projected area B is 1 or larger, the projected areas A and B being projected areas observed from a direction perpendicular to a principal plane of the plate-shaped resin-impregnated boron nitride sintered body, the projected area A being a projected area of a profile of the metal circuit, the projected area B being a projected area of a profile of the plate-shaped resin-impregnated boron nitride sintered body.

8. A power module comprising the boron nitride/resin composite circuit board of claim 1.

9. A circuit board including boron nitride/resin composite integrated with heat dissipation plate, comprising:
   a resin-impregnated boron nitride sintered body comprising 30 to 85 volume % of a boron nitride sintered body having boron nitride particles bonded three-dimensionally, the boron nitride particles having an average long diameter of 5 to 50 μm, and 70 to 15 volume % of a resin;

a metal circuit having a thickness of 0.03 to 3.0 mm formed onto one principal plane of the resin-impregnated boron nitride sintered body with an intermediary of an adhesion layer; and a metal heat dissipation plate having a thickness of 2.0 to 7.0 mm formed onto a rear surface of the resin-impregnated boron nitride sintered body with an intermediary of an adhesion layer.

10. The circuit board including boron nitride/resin composite integrated with heat dissipation plate of claim 9, wherein the metal circuit and the metal heat dissipation plate comprises copper, aluminum, or an alloy thereof.

11. The circuit board including boron nitride/resin composite integrated with heat dissipation plate of claim 9, wherein the metal circuit and the metal heat dissipation plate is a different metal.

12. The circuit board including boron nitride/resin composite integrated with heat dissipation plate of claim 9, wherein a thermal conductivity of the resin-impregnated boron nitride sintered body in a plate thickness direction is 20 W/mK or more, and a thermal coefficient of linear expansion in a plane direction in a temperature range of 25 to 200° C. is 12 to 30 ppm/K.

13. A power module comprising the circuit board including boron nitride/resin composite integrated with heat dissipation plate of claim 9.

* * * * *